(12) United States Patent
Kwon et al.

(10) Patent No.: US 11,462,173 B2
(45) Date of Patent: Oct. 4, 2022

(54) DISPLAY DEVICE

(71) Applicant: Samsung Display Co., Ltd., Yongin-si (KR)

(72) Inventors: Tae Hoon Kwon, Yongin-si (KR); Ji Hyun Ka, Yongin-si (KR); Nack Hyeon Keum, Yongin-si (KR); Jae Jin Song, Yongin-si (KR); Kwang Sae Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/146,358

(22) Filed: Jan. 11, 2021

(65) Prior Publication Data

US 2021/0375212 A1 Dec. 2, 2021

(30) Foreign Application Priority Data

Jun. 2, 2020 (KR) .................. 10-2020-0066743

(51) Int. Cl.
*G09G 3/3233* (2016.01)
*G09G 3/3266* (2016.01)
*G09G 3/22* (2006.01)

(52) U.S. Cl.
CPC ............ *G09G 3/3266* (2013.01); *G09G 3/22* (2013.01); *G09G 2300/0413* (2013.01); *G09G 2310/0264* (2013.01); *G09G 2310/0286* (2013.01); *G09G 2310/08* (2013.01); *G09G 2330/028* (2013.01)

(58) Field of Classification Search
CPC ...... G09G 3/22; G09G 3/3291; G09G 3/3233; G09G 3/3266; G09G 2300/0408; G09G 2300/0413; G09G 2310/0264; G09G 2310/0286; G09G 2310/08; G09G 2320/02; G09G 2320/0238; G09G 2320/0247; G09G 2330/028; G11C 19/28
See application file for complete search history.

(56) References Cited

U.S. PATENT DOCUMENTS

| 9,548,026 | B2 | 1/2017 | Jang | |
|---|---|---|---|---|
| 2016/0321990 | A1* | 11/2016 | Kim | ................... G09G 3/3233 |
| 2017/0052635 | A1* | 2/2017 | Yu | ............................. G09G 3/20 |
| 2017/0337864 | A1* | 11/2017 | Igeta | ........................ G02F 1/133 |

(Continued)

FOREIGN PATENT DOCUMENTS

| KR | 10-1975581 | 9/2019 |
|---|---|---|
| KR | 10-2021-0152085 | 12/2021 |

*Primary Examiner* — Michael J Eurice
(74) *Attorney, Agent, or Firm* — H.C. Park & Associates, PLC

(57) ABSTRACT

A display device includes: a substrate including a display area and a non-display area; pixels connected to first scan lines, second scan lines, third scan lines, and emission control lines; a first scan driver supplying a first scan signal to the first scan lines; a second scan driver supplying a second scan signal to some of the second scan lines and supplying a third scan signal to the third scan lines; an emission driver supplying an emission control signal to the emission control lines; a first pad and a second pad provided in the non-display area; a first power line connected to the first pad, the first power line transferring a first voltage to the first scan driver and the emission driver; and a second power line connected to the second pad, the second power line transferring a second voltage to the second scan driver.

19 Claims, 13 Drawing Sheets

(56) References Cited

U.S. PATENT DOCUMENTS

| | | | | |
|---|---|---|---|---|
| 2018/0006099 A1* | 1/2018 | Ka | ................... | H01L 27/3262 |
| 2018/0075804 A1* | 3/2018 | Kim | ................... | G09G 3/3233 |
| 2018/0149889 A1* | 5/2018 | Kim | ................... | G11C 19/28 |
| 2018/0174525 A1* | 6/2018 | Kim | ................... | G09G 3/3283 |
| 2018/0342572 A1* | 11/2018 | Park | ................... | H01L 27/124 |
| 2019/0035336 A1* | 1/2019 | Park | ................... | G09G 3/3233 |
| 2019/0096330 A1* | 3/2019 | Kim | ................... | G09G 3/3266 |
| 2019/0131378 A1* | 5/2019 | Sung | ................... | H01L 51/5284 |
| 2019/0147798 A1* | 5/2019 | Hwang | ............... | G09G 3/3233 345/691 |
| 2021/0201825 A1* | 7/2021 | Yun | ................... | G09G 3/3291 |
| 2021/0383760 A1 | 12/2021 | In | | |

* cited by examiner

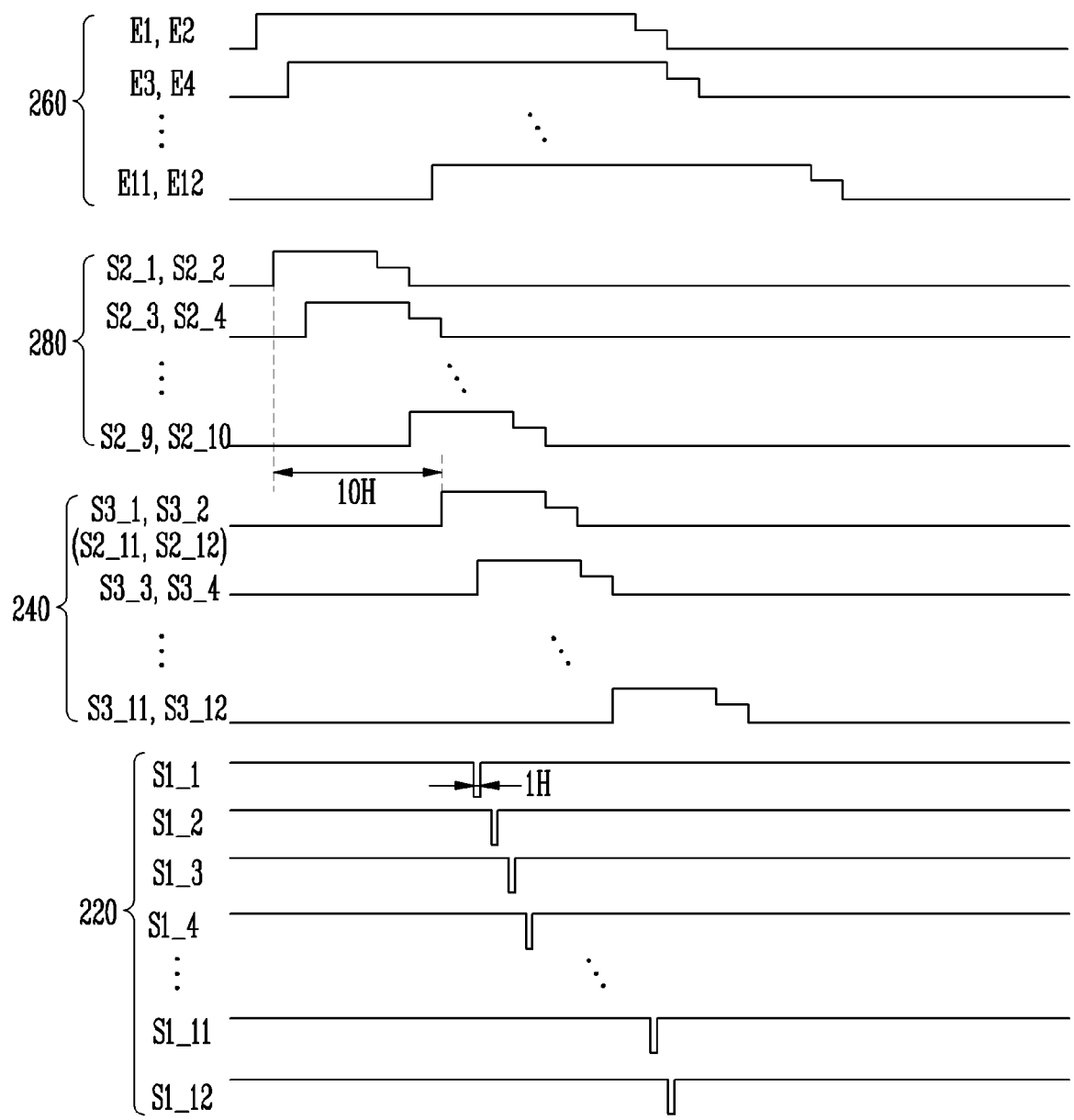

DISPLAY DEVICE

CROSS-REFERENCE TO RELATED APPLICATION

This application claims priority from and the benefit of Korean Patent Application No. 10-2020-0066743, filed on Jun. 2, 2020, which is hereby incorporated by reference for all purposes as if fully set forth herein.

BACKGROUND

Field

Embodiments of the invention relate generally to a display device, and more particularly, to a display device including a plurality of scan drivers.

Discussion of the Background

A display device includes a data driver, a gate driver, and pixels. The data driver provides data signals to the pixels through data lines. The gate driver generates a gate signal by using gate power voltages and a clock signal, which are provided from the outside, and provides the gate signal to the pixels through gate lines.

The gate driver may include a plurality of scan drivers which output different scan signals, and an emission driver which outputs an emission control signal according to a circuit structure of the pixel.

The above information disclosed in this Background section is only for understanding of the background of the inventive concepts, and, therefore, it may contain information that does not constitute prior art.

SUMMARY

Display devices constructed according to embodiments of the invention are capable of decreasing a dead space by integrating some of scan drivers.

Embodiments also provide a display device in which power lines connected to a second driver and power lines connected to a first scan driver and an emission driver are electrically and physically separated from each other.

Additional features of the inventive concepts will be set forth in the description which follows, and in part will be apparent from the description, or may be learned by practice of the inventive concepts.

A display device according to an embodiment includes: a substrate including a display area and a non-display area; pixels disposed in the display area, the pixels being connected to first scan lines, second scan lines, third scan lines, and emission control lines; a first scan driver disposed in the non-display area, the first scan driver supplying a first scan signal to the first scan lines; a second scan driver disposed in the non-display area, the second scan driver supplying a second scan signal to some of the second scan lines and a third scan signal to the third scan lines; an emission driver disposed in the non-display area, the emission driver supplying an emission control signal to the emission control lines; a first pad and a second pad disposed in the non-display area while being spaced apart from each other; a first power line connected to the first pad, the first power line transferring a first voltage to the first scan driver and the emission driver; and a second power line connected to the second pad, the second power line transferring a second voltage to the second scan driver.

The first power line may branch off in the non-display area to be connected to the first driver and the emission driver.

The first voltage and the second voltage may be substantially the same.

The second power line may not be electrically and physically connected to the first power line in the non-display area.

The display device may further include: a third pad and a fourth pad, disposed in the non-display area while being spaced apart from each other; a third power line connected to the third pad, the third power line transferring a third voltage higher than the first voltage to the first scan driver and the emission driver; and a fourth power line connected to the fourth pad, the fourth power line transferring a fourth voltage higher than the second voltage to the second scan driver.

The third power line may branch off in the non-display area to be connected to the first scan driver and the emission driver.

The third voltage and the fourth voltage may be substantially the same.

The fourth power line may not be electrically and physically connected to the third power line in the non-display area.

Each of the first scan driver, the second scan driver, and the emission driver may include stages. Each of the stages may include a first power input terminal, a second power input terminal, and a third power input terminal.

The first power line may branch off into a first scan power line, a second scan power line, a first emission power line, and a second emission power line. The first scan power line and the second power scan line may be connected to the stages of the first scan driver, and the first emission power line and the second emission power line may be connected to the stages of the emission driver.

The first scan power line may be connected to the first power input terminal, the second scan power line may be connected to the second power input terminal, and the third power line may be connected to the third power input terminal.

The second power line may branch off into a third scan power line and a fourth scan power line. The third scan power line and the fourth scan power line may be connected to the stages of the second scan driver.

The display device may further include a dummy scan driver disposed in the non-display area, the dummy scan driver supplying the second scan signal to the others of the second scan lines.

The dummy scan driver may include a plurality of dummy stages which sequentially output the second scan signal.

An output of a last dummy stage of the dummy scan driver may be supplied as an input of a first stage of the second scan driver.

The third scan signal supplied to an $i^{th}$ (i is a positive integer) pixel row may be identical to a signal shifted by a predetermined $k^{th}$ horizontal periods (k is an integer of 8 or more) from the second scan signal. Widths of gate-on periods of the first scan signal, the second scan signal, and the emission control signal may be different from one another.

Each of the dummy stages may be connected to the second scan lines of two or more consecutive pixel rows. The dummy scan driver may be connected to the second scan lines of first to kth pixel rows.

The second scan driver may be connected to the third scan lines of the first to kth pixel rows, and be connected to the second and third scan lines of $(k+1)^{th}$ to $n^{th}$ (n is an integer greater than k+1) pixel rows.

A first stage of the second scan driver may be connected to a third scan line of the first pixel row and a second scan line of the $(k+1)^{th}$ pixel row.

A display device according to another embodiment includes: pixels connected to first scan lines, second scan lines, third scan lines, and emission control lines; a first scan driver configured to supply a first scan signal to the first scan lines; a second scan driver configured to supply a second scan signal to some of the second scan lines, and supply a third scan signal to the third scan lines; an emission driver configured to supply an emission control signal to the emission control lines; and a dummy scan driver including dummy stages which supply the second scan signal to the others of the second scan lines, in which the dummy scan driver is connected to the second scan lines of first to $k^{th}$ (k is an integer greater than 1) pixel rows, and the second scan driver is connected to the third scan lines of the first to $k^{th}$ pixel rows, and is connected to the second and third scan lines of $(k+1)^{th}$ to $n^{th}$ (n is an integer greater than k+1) pixel rows.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

FIG. 10 is an example of a waveform diagram of signals output from the gate driver shown in FIG. 9.

DETAILED DESCRIPTION

Figure 1:
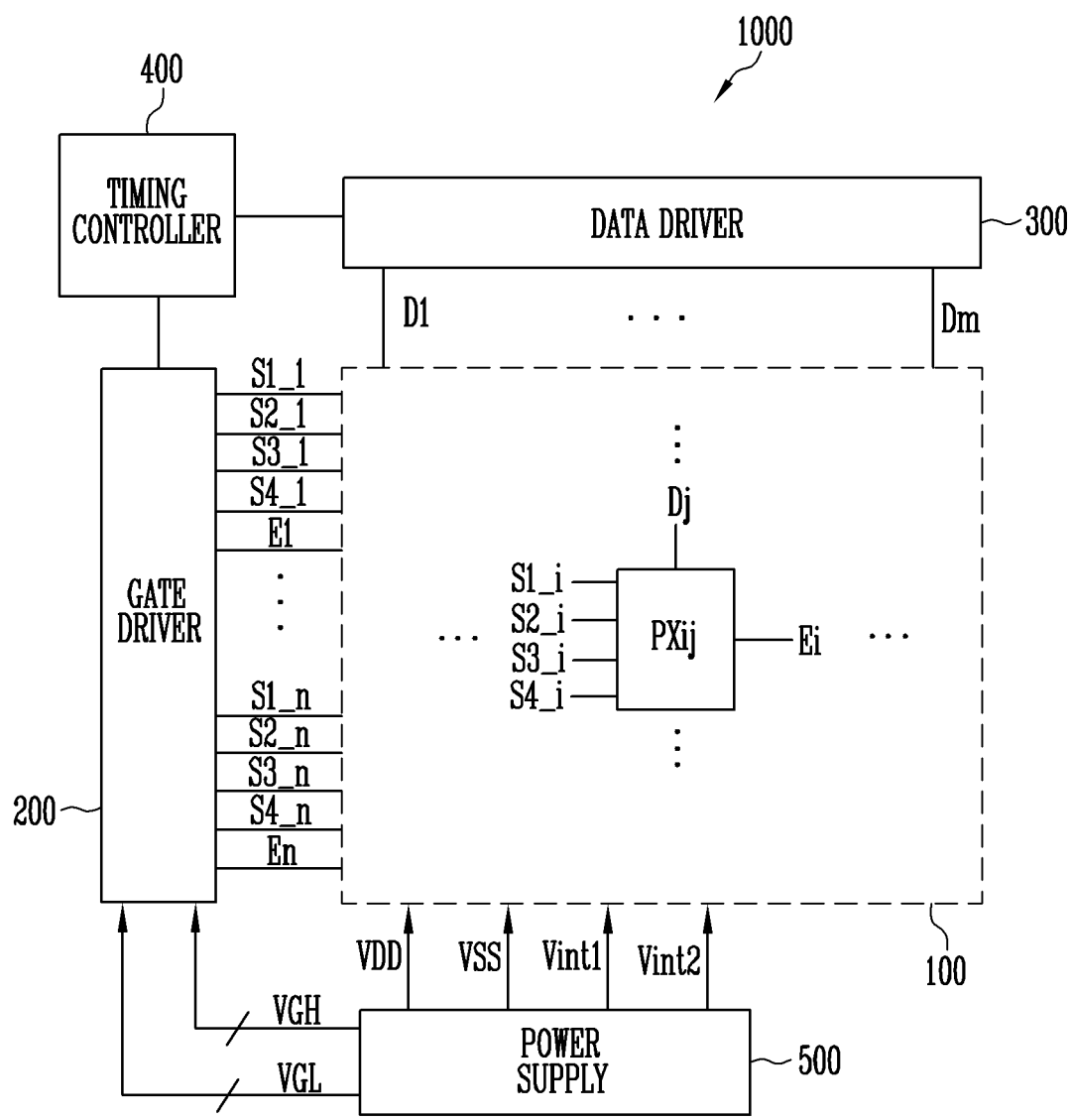
FIG. 1 is a diagram illustrating a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a diagram of a display device according to an exemplary embodiment.

Referring to FIG. 1, the display device 1000 may include a pixel unit 100, a gate driver 200, a data driver 300, and a timing controller 400. The display device 1000 may further include a power supply 500.

The display device 1000 may display an image at various frame frequencies (e.g., refresh rates, driving frequencies, or screen refresh rates) according to a driving condition. The frame frequency is a frequency at which a data voltage is substantially written to a driving transistor of a pixel PXij during one second. For example, the frame frequency is referred to as a screen scanning rate or a screen refresh frequency, and represents a frequency at which a display screen is refreshed during one second.

In an embodiment, the display device 1000 may adjust an output frequency of the gate driver 200 and an output frequency of the corresponding data driver 300 according to a driving condition. For example, the display device 1000 may display an image in accordance to various frame frequencies of 1 Hz to 120 Hz. However, the inventive concepts are not limited thereto, and the display device 1000 may display an image at a frame frequency of 120 Hz or more (e.g., 240 Hz or 480 Hz).

The pixel unit 100 may include scan lines S1_1 to S1_$n$, S2_1 to S2_$n$, S3_1 to S3_$n$, and S4_1 to S4_$n$, emission control lines E1 to En, and data lines D1 to Dm (m and n are integers greater than 1). Also, the pixel unit 100 may include pixels PXij connected to the scan lines S1_1 to S1_$n$, S2_1 to S2_$n$, S3_1 to S3_$n$, and S4_1 to S4_$n$, the emission control lines E1 to En, and the data lines D1 to Dm. Each of the pixels PXij may include a driving transistor and a plurality of switching transistors. In addition, the pixels PXij may constitute a plurality of pixel rows in a unit in which the emission control lines E1 to En are connected. For example, pixels PXij connected to a first emission control line E1 may be referred to as a first pixel row.

The timing controller 400 may receive an external input signal from a host system, such as an application processor (AP), through a predetermined interface. The external input signal may include a vertical synchronization signal, a horizontal synchronization signal, a data enable signal, RGB data, and a clock signal.

The vertical synchronization signal may include a plurality of pulses. With respect to a time at which each of the pulses is generated, a previous frame period may be ended and a current frame period may be started. An interval between adjacent pulses among the pulses of the vertical synchronization signal may correspond to one frame period. The horizontal synchronization signal may include a plurality of pulses. With reference to a time at which each of the pulses is generated, a previous horizontal period may be ended and a new horizontal time may be started. An interval between adjacent pulses among the pulses of the horizontal synchronization signal may correspond to one horizontal period. The data enable signal may indicate that RGB data is supplied in a horizontal period. For example, the RGB data may be supplied in a pixel row unit (e.g., to pixels connected to the same first scan lines) in horizontal periods, corresponding to the data enable signal.

The timing controller 400 may generate control signals for the gate driver 200 and the data driver 300 based on an external input signal to correspond to specifications of the display device.

The gate driver 200 may receive control signals from the timing controller 400, and generate gate signals based on the control signals. In an embodiment, the gate driver 200 may include a first scan driver connected to first scan lines S1_1 to S1_n and fourth scan lines S4_1 to S4_n, a second driver connected to second scan lines S2_1 to S2_n and third scan lines S3_1 to S3_n, and an emission driver connected to the emission lines E1 to En.

The gate signals may include a first scan signal, a second scan signal, a third scan signal, a fourth scan signal, and an emission control signal. In some embodiments, the fourth scan signal may be identical to the first scan signal. Hereinafter, the first scan signal may inclusively mean the fourth scan signal.

The gate driver 200 may generate the first scan signal, the second scan signal, the third scan signal, and the emission control signal that have a gate-on level based on gate power voltages VGL and VGH supplied from the power supply 500.

The gate driver 200 may include a first scan driver, a second scan driver, and an emission driver. The first scan driver may generate the first scan signal by using the gate power voltages VGL and VGH, and the second scan driver may generate the second scan signal and the third scan signal by using the gate power voltages VGL and VGH. The emission driver may generate the emission control signal by using the gate power voltages VGL and VGH.

The first to third scan signals may be set to a gate-on voltage corresponding to the type of transistors to which the corresponding scan signals are supplied. A transistor receiving a scan signal may be set to a turn-on state when the scan signal is supplied. For example, a gate-on voltage of a scan signal supplied to a P-channel metal oxide semiconductor (PMOS) transistor may have a logic low level, and a gate-on voltage of a scan signal supplied to an N-channel metal oxide semiconductor (NMOS) transistor may have a logic high level. Hereinafter, "scan signal is supplied" may refer that the scan signal is supplied at a logic level at which a transistor controlled by the scan signal is turned on.

The emission control signal may be set to a gate-off voltage (e.g., a high voltage). A transistor receiving the emission control signal may be turned off when the emission control signal is supplied, and be set to the turn-on state otherwise. Hereinafter, "emission control signal is supplied" may refer that the emission control signal is supplied at a logic level at which a transistor controlled by the emission control signal is turned off.

The power supply 500 may supply the gate power voltages VGL and VGH to the gate driver 200 through power lines. A first gate power voltage VGL may be a low voltage, and a second gate power voltage VGH may be a high voltage. A logic high level of the gate signals may be generated based on the second gate power voltage VGH, and a logic low level of the gate signals may be generated based on the first gate power voltage VGL.

In an embodiment, the power supply 500 may generate a first driving voltage VDD, a second driving voltage VSS, a first initialization voltage Vint1, and a second initialization voltage Vint2, which are used to drive the pixel PXij, and supply the generated voltages to the pixel unit 100.

The data driver 300 may receive a control signal and image data, which are supplied from the timing controller 400. The data driver 300 may convert the image data RGB in a digital form into an analog data signal (data voltage). The data driver 300 may supply a data signal to the data lines D1 to Dm. The data signal supplied to the data lines D1 to Dm may be supplied to be synchronized with the first scan signal supplied to the first scan lines S1_1 to S1_n.

Each of the data driver 300, the timing controller 400, and the power supply 500 may be implemented as an independent integrated circuit, but the inventive concepts are not limited thereto. For example, the data driver 300, the timing controller 400, and the power supply 500 may be implemented as a single integrated circuit. Alternatively, functions of at least some of the data driver 300, the timing controller 400, and the power supply 500 may be implemented with a single integrated circuit. For example, in some embodiments, the gate power voltages VGL and VGH may be supplied from the data driver 300 to the gate driver 200.

Figure 2:
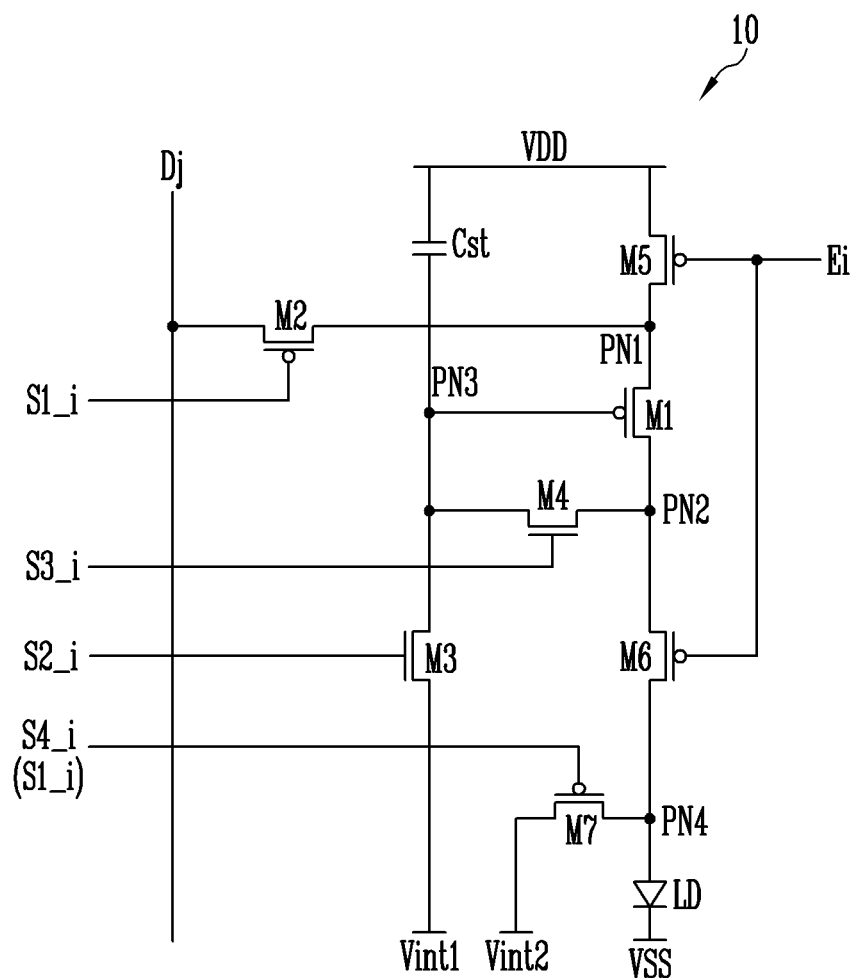
FIG. 2 is an example of a circuit diagram of a pixel included in the display device shown in FIG. 1.

FIG. 2 is an example of a circuit diagram of the pixel included in the display device shown in FIG. 1.

FIG. 2 shows a pixel 10 which is located on an $i^{th}$ horizontal line (or $i^{th}$ pixel row) and connected to a $j^{th}$ data line Dj, in which i and j are natural numbers.

Figure 3:
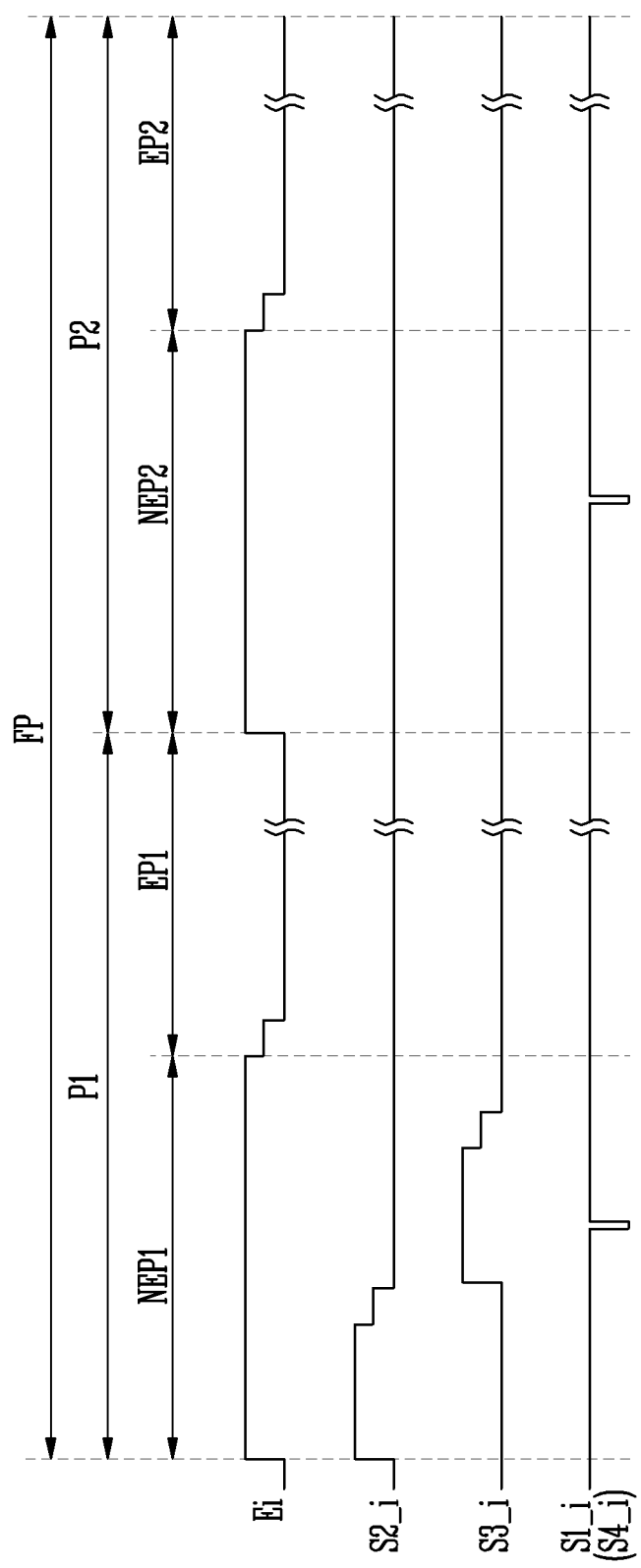
FIG. 3 is an example of a timing diagram of signals supplied to the pixel shown in FIG. 2.

Referring to FIGS. 1 and 3, the pixel 10 may include a light emitting device LD, first to seventh transistors M1 to M7, and a storage capacitor Cst.

A first electrode (anode electrode or cathode electrode) of the light emitting device LD may be connected to the sixth transistor M6, and a second electrode (cathode electrode or anode electrode) of the light emitting device LD may be connected to the second driving voltage VSS. The light emitting device LD may generate light with a predetermined luminance in accordance to an amount of current supplied from the first transistor T1.

In an embodiment, the light emitting device LD may be an organic light emitting diode including an organic emitting layer. In another embodiment, the light emitting device LD may be an inorganic light emitting device formed of an inorganic material. In yet another embodiment, the light emitting device LD may be a light emitting device complexly configured with an inorganic material and an organic material. Still alternatively, the light emitting device LD may have a form in which a plurality of inorganic light emitting devices are connected in parallel and/or series between a line for transferring the second voltage VSS and the sixth transistor M6.

A first electrode of the first transistor M1 (or driving transistor) may be connected to a first pixel node PN1, and a second electrode of the first transistor M1 may be connected to a second pixel node PN2. A gate electrode of the first transistor M1 may be connected to a third pixel node PN3. The first transistor M1 may control an amount of current flowing through the light emitting device LD in accordance to a voltage of the third pixel node PN3. To this end, the first driving voltage VDD may be set as a voltage higher than the second driving voltage VSS.

The second transistor M2 may be connected between the $j^{th}$ data line Dj (hereinafter, referred to as a data line). A gate electrode of the second transistor M2 may be connected to an $i^{th}$ first scan line S1_$i$ (hereinafter, referred to as a first scan line). The second transistor M2 may be turned on when a first scan signal is supplied to the first scan line S1_$i$ to electrically connect the data line Dj and the first pixel node PN1.

The third transistor M3 may be connected between the third pixel node PN3 and a line for transferring the first initialization voltage Vint1. A gate electrode of the third transistor M3 may be connected to an $i^{th}$ second scan line S2_$i$ (hereinafter, referred to as a second scan line). The third transistor M3 may be turned on when a second scan signal is supplied to the second scan line S2_$i$ to supply the first initialization voltage Vint1 to the third pixel node PN3. The first initialization voltage Vint1 may be set as a voltage lower than that of a data signal supplied to the data line Dj. In an embodiment, the first initialization voltage Vint1 may be set to a value which is equal to or less than that of a voltage of a white grayscale. For example, the first initialization voltage Vint1 may be about −2V.

Accordingly, a gate voltage of the first transistor M1 may be initialized to the first initialization voltage Vint1 when the third transistor M3 is turned on.

The fourth transistor M4 may be connected between the second electrode of the first transistor M1 (i.e., the second pixel node PN2) and the third pixel node PN3. A gate electrode of the fourth transistor M4 may be connected to an $i^{th}$ third scan line S3_$i$ (hereinafter, referred to as a third scan line). The fourth transistor M4 may be turned on when a third scan signal is supplied to the third scan line S3_$i$ to electrically connect the second electrode of the first transistor M1 and the third pixel node PN3. More particularly, a timing at which the second electrode (e.g., a drain electrode) of the first transistor M1 and the gate electrode of the first transistor M1 are connected to each other may be controlled by the third scan signal. When the fourth transistor M4 is turned on, the first transistor M1 may be connected in a diode form.

The fifth transistor M5 may be connected between a line for transferring the first driving voltage VDD and the first pixel node PN1. A gate electrode of the fifth transistor M5 may be connected to an $i^{th}$ emission control line Ei (hereinafter, referred to as an emission control line). The fifth transistor M5 may be turned off when an emission control signal is supplied to the emission control line Ei, and be turned on otherwise.

The sixth transistor M6 may be connected between the second electrode of the first transistor M1 (i.e., the second pixel node PN2) and the first electrode of the light emitting device LD (i.e., a fourth pixel node PN4). A gate electrode of the sixth transistor M6 may be connected to the emission control line Ei. The sixth transistor M6 may be controlled substantially identically to the fifth transistor M5.

The seventh transistor M7 may be connected between the first electrode of the light emitting device LD (i.e., the fourth pixel node PN4) and a line for transferring the second initialization voltage Vint2. A gate electrode of the seventh transistor M7 may be connected to an $i^{th}$ fourth scan line S4_$i$ (hereinafter, referred to as a fourth scan line). In an embodiment, the same first scan signal may be supplied to the fourth scan line S4_$i$ and the first scan line S1_$i$. In this case, the gate electrode of the seventh transistor M7 may be considered as being connected to the first scan line S1_$i$. The seventh transistor M7 may be turned on when the first scan signal is supplied to the first scan line S1_$i$ to supply the second initialization voltage Vint2 to the first electrode of the light emitting device LD.

When the second initialization voltage Vint2 is supplied to the first electrode of the light emitting device LD, a parasitic capacitor of the light emitting device LD may be discharged. In this manner, since a residual voltage charged in the parasitic capacitor is discharged (removed), unintended minute emission can be prevented. As such, the black expression ability of the pixel 10 can be improved.

The first initialization voltage Vint1 and the second initialization voltage Vint2 may be different from each other. More particularly, a voltage for initializing the third pixel node PN3 and a voltage for initializing the fourth pixel node PN4 may be set to be different from each other.

In low-frequency driving in which the length of one frame period is lengthened, when the voltage of the first initialization voltage Vint1 supplied to the third pixel node PN3 is excessively low, a strong on-bias is applied to the first transistor M1, which may shift a threshold voltage of the first transistor M1 in the corresponding frame period. Such a hysteresis characteristic may cause a flicker phenomenon in the low-frequency driving. As such, the first initialization voltage Vint1 higher than the second driving voltage VSS may be required in the display device operating under the low-frequency driving.

However, when the second initialization voltage Vint2 supplied to the fourth pixel node PN4 is higher than a predetermined reference voltage, the voltage of the parasitic capacitor of the light emitting device LD is not discharged, but rather the parasitic capacitor may be charged. As such, the second initialization voltage Vint2 may need to be similar to or lower than the second driving voltage VSS. For example, the second initialization voltage Vint2 may be about −4V. Also, the second initialization voltage Vint2 may be set to a voltage value lower than that of the first initialization voltage Vint1.

The storage capacitor Cst may be connected between the line for transferring the first driving voltage VDD and the third pixel node PN3. The storage capacitor Cst may store a voltage applied to the third pixel node PN3.

According to an embodiment, the first transistor M1, the second transistor M2, the fifth transistor M5, the sixth transistor M6, and the seventh transistor M7 may be implemented with a poly-silicon semiconductor transistor. For example, the first transistor M1, the second transistor M2, the fifth transistor M5, the sixth transistor M6, and the seventh transistor M7 may include a poly-silicon semiconductor layer formed as an active channel through a low temperature poly-silicon (LTPS) process. Also, the first transistor M1, the second transistor M2, the fifth transistor M5, the sixth transistor M6, and the seventh transistor M7 may be implemented with a P-type transistor (e.g., a PMOS transistor). Accordingly, a gate-on voltage at which the first transistor M1, the second transistor M2, the fifth transistor M5, the sixth transistor M6, and the seventh transistor M7 are turned on may have a logic low level.

Since the poly-silicon semiconductor transistor has a fast response speed, the poly-silicon semiconductor transistor may be applied to a switching element which requires fast switching.

The third transistor M3 and the fourth transistor M4 may be implemented with an oxide semiconductor transistor. For example, the third transistor M3 and the fourth transistor M4 may be implemented with an N-type oxide semiconductor transistor (e.g., an NMOS transistor), and include an oxide semiconductor layer as an active layer. Accordingly, a gate-on voltage at which the third transistor M3 and the fourth transistor M4 are turned on may have a logic high level.

The oxide semiconductor transistor can be formed through a low temperature process, and have a charge mobility lower than that of a poly-silicon semiconductor transistor. That is, the oxide semiconductor transistor has an excellent off-current characteristic. As such, when the third transistor M3 and the fourth transistor M4 are implemented with the oxide semiconductor transistor, leakage current from the second pixel node PN2 according to the low-frequency driving can be minimized, and accordingly, display quality can be improved.

FIG. 3 is an example of a timing diagram of signals supplied to the pixel shown in FIG. 2.

Referring to FIGS. 2 and 3, in variable frequency driving for controlling a frame frequency, one frame period FP may include a first period P1 (e.g., a display scan period) and at least one second period P2 (e.g., a bias scan period).

The first scan signal may be supplied to the first scan line S1_i, the second scan signal may be supplied to the second scan line S2_i, the third scan signal may be supplied to the third scan line S3_i, and the emission control signal may be supplied to the emission control line Ei.

The first period may include a first non-emission period NEP1 and a first emission period EP1. The second period P2 may include a second non-emission period NEP2 and a second emission period EP2.

The first period includes a period in which a data signal actually corresponding to an output image is written to the gate electrode of the first transistor M1 (or the storage capacitor Cst). For example, when a still image is displayed through low-frequency driving, the data signal may be written to the gate electrode of the first transistor M1 in the first period P1.

The second period P2 may include a period in which a voltage (or data signal) supplied through the data line Dj is supplied to a source electrode of the first transistor M1 (i.e., the first pixel node PN1). For example, when a predetermined voltage is supplied to the source electrode of the first transistor M1, a bias state of the first transistor M1 may be controlled.

As shown in FIG. 3, the emission control signal and the first scan signal may be supplied at a first frequency higher than the frame frequency. The second scan signal and the third scan signal may be supplied at a second frequency lower than the first frequency. For example, the first frequency may be 240 Hz, and the second frequency may be 60 Hz. The frequency of the second scan signal and the third scan signal may be substantially equal to the frame frequency.

However, the inventive concepts are not limited thereto. In some embodiments, the first frequency may be higher than 120 Hz, and the second frequency may be 60 Hz or lower. A number of times the second period P2 is repeated in the frame period FP (i.e., a number of bias scan periods) may increase as the second frequency becomes lower, or as a difference between the first frequency and the second frequency becomes larger. For example, the frame period FP may include one display scan period and a plurality of continuous second periods P2 according to the frame frequency.

In an embodiment, the second scan signal and the third scan signal may be supplied only in the first non-emission period NEP1.

In an embodiment, the first scan signal may be supplied in the first non-emission period NEP1 and the second non-emission period NEP2. In the first non-emission period NEP1, the first scan signal may play a role of writing a data signal to the pixel 10. In the second non-emission period NEP2, the first scan signal may play a role of controlling the bias state of the first transistor M1.

A period in which the emission control signal has a logic low level may correspond to the emission periods EP1 and EP2, and a period except the emission periods EP1 and EP2 may correspond to the non-emission periods NEP1 and NEP2.

A gate-on voltage of the second scan signal and the third scan signal, which are respectively supplied to the third transistor M3 and the fourth transistor M4 that are implemented as an N-type transistor, has a logic high level. A gate-on voltage of the first scan signal supplied to each of the second transistor M2 and the seventh transistor M7, which are implemented as a P-type transistor, has a logic low level.

Hereinafter, scan signals supplied in the first period P1 and the second period P2 and an operation of the pixel 10 will be described in more detail with reference to FIG. 3.

The second scan signal may be supplied to the second scan line S2_i in the first non-emission period NEP1. When the third transistor M3 is turned on in response to the second scan signal, the gate voltage of the first transistor M1 may be initialized.

Subsequently, the third scan signal may be supplied to the third scan line S3_i. The second scan signal and the third scan signal may not overlap with each other. In an embodiment, the third scan signal may be a signal obtained by shifting the second scan signal by a predetermined horizontal period. In this manner, the second scan signal and the third scan signal may be output from one scan driver.

The fourth transistor M4 may be turned on in response to the third scan signal.

The first scan signal may be supplied to the first scan line S1_i in a state in which the fourth transistor M4 is turned on. In response to the first scan signal, the second transistor M2 may be turned on, the first transistor M1 is connected in the diode form, and data signal writing and threshold voltage compensation may be performed. Since the supply of the third scan signal is maintained even after the supply of the first signal is suspended, the threshold voltage of the first transistor M1 can be compensated for a sufficient time.

Subsequently, the supply of the emission control signal is suspended, and the pixel 10 may emit light during the first emission period EP1.

The first scan signal may be supplied to the first scan line S1_i in the second non-emission period NEP2. Accordingly, the bias state of the first transistor M1 can be periodically controlled regardless of the frame frequency.

Meanwhile, the second scan signal and the third scan signal are not supplied in the second period P2. The number of times the second period P2 of the frame period FP is repeated and the time for which the second scan signal and the third scan signal are not supplied may be increased as the frame frequency becomes lower.

Figure 4:
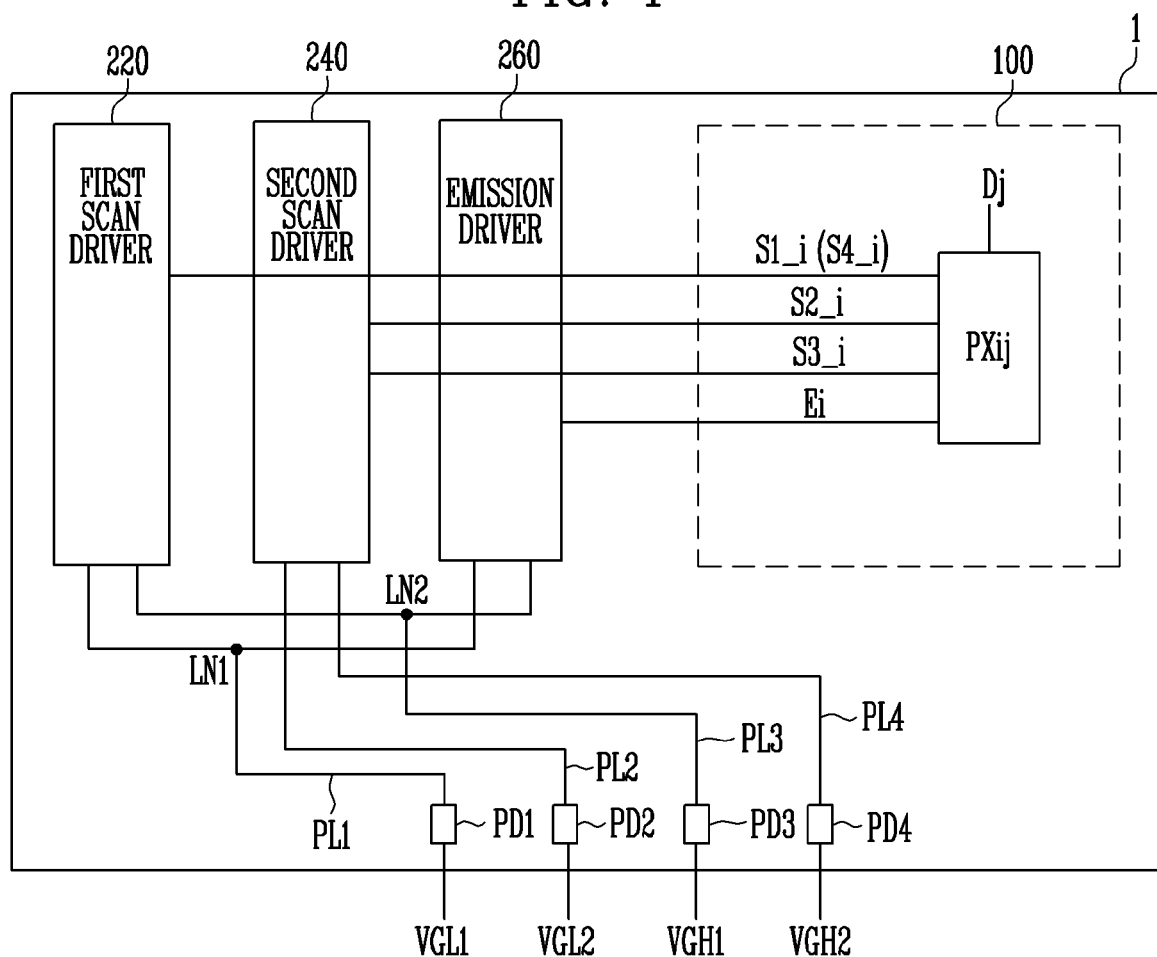
FIG. 4 is a schematic plan view illustrating a portion of the display device shown in FIG. 1 according to an embodiment.

FIG. 4 is a schematic plan view illustrating a portion of the display device shown in FIG. 1 according to an embodiment.

Referring to FIGS. 1 to 4, the gate driver 200 may include a first scan driver 220, a second scan driver 240, and an emission driver 260.

The display device 1000 may include a substrate 1. The substrate 1 may include a display area and a non-display area located near at least one side of the display area.

The pixel unit 100 including the pixels PXij may be provided in the display area of the substrate 1. In FIG. 4, the display area may correspond to the pixel unit 100.

The first scan driver 220, the second scan driver 240, and the emission driver 260 may be provided in the non-display area of the substrate 1, and a plurality of pads PD1, PD2, PD3, and PD4 may be disposed in the non-display area of the substrate 1. The non-display area may correspond to an area of the substrate 1 excluding the pixel unit 100.

The first scan driver 220 may be connected to the first scan line S1_i to supply the first scan signal to the pixel PXij.

The second scan driver 240 may be connected to the second scan line S2_i and the third scan line S3_i to supply the second scan signal and the third scan signal to the pixel PXij. In this manner, one of scan drivers for generating the second scan signal or the third scan signal in the conventional display device may be omitted.

The emission driver 260 may be connected to the emission control line Ei to supply the emission control signal to the pixel PXij.

First to fourth pads PD1, PD2, PD3, and PD4 may be connected to lines for transferring first to fourth voltages VGL1, VGL2, VGH1, and VGH2 supplied from the power supply 500. Each of the first to fourth voltages VGL1, VGL2, VGH1, and VGH2 may be one of the gate power voltages VGL and VGH described above with reference to FIG. 1.

Figure 5:
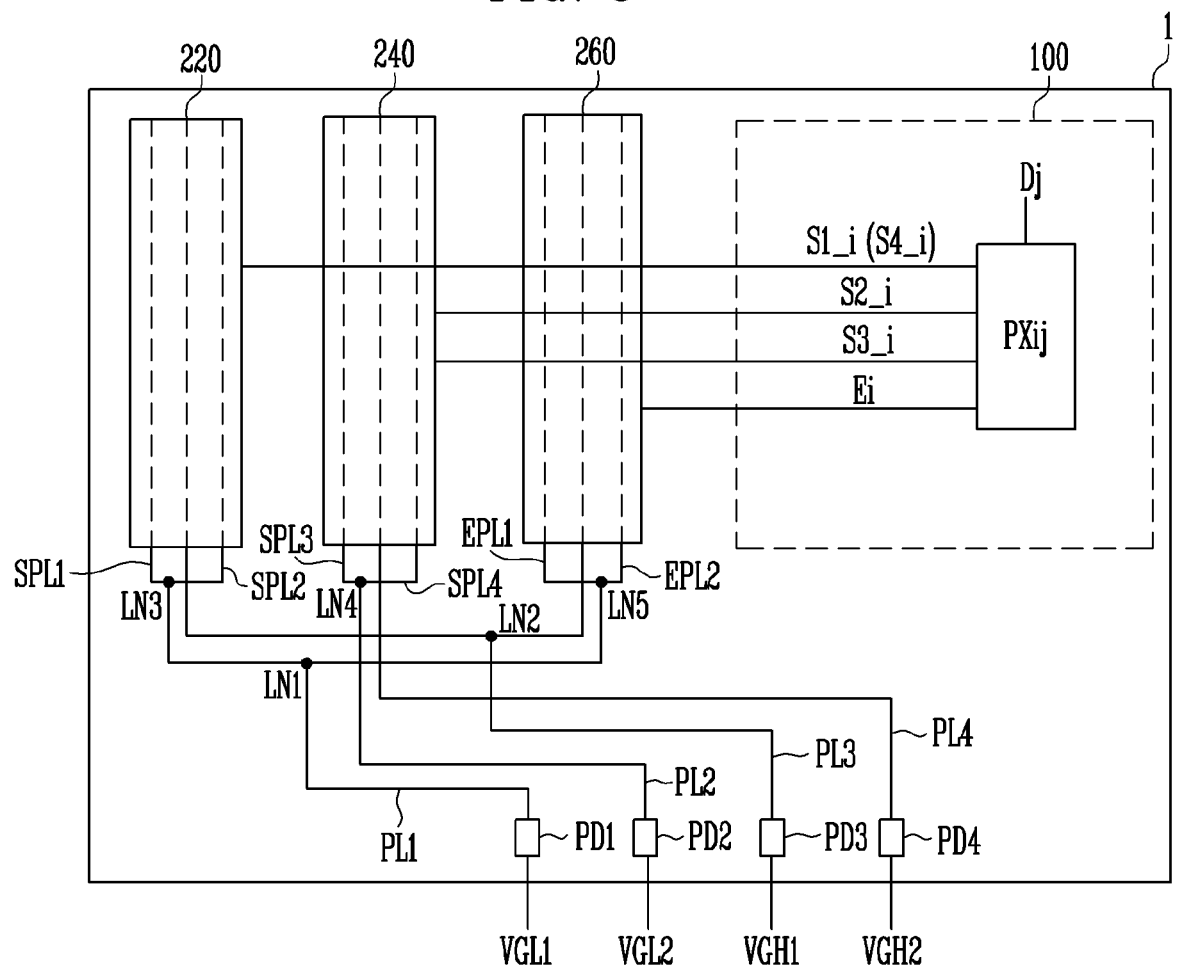
FIG. 5 is a schematic plan view illustrating the portion of the display device shown in FIG. 1 according to another embodiment.

The arrangement position of the gate driver 200 and the arrangement position of the pads PD1, PD2, PD3, and PD4 shown in FIG. 5 are merely illustrative, and the inventive concepts are not limited to a particular position of the components therein. For example, in some embodiments, the first scan driver 220 and the emission driver 260 may be reversely disposed.

The first voltage VGL1 (hereinafter, referred to as a first low voltage) may be transferred to the first pad PD1, and the second voltage VGL2 (hereinafter, referred to as a second low voltage) may be transferred to the second pad PD2. In some embodiments, the first low voltage VGL1 and the second low voltage VGL2 may have substantially the same voltage value. For example, the first low voltage VGL1 and the second low voltage VGL2 may have the same first gate power voltage VGL value. However, the inventive concepts are not limited thereto, and the first low voltage VGL1 and the second low voltage VGL2 may be different from each other in other embodiments.

A logic low level of the scan signals and the emission control signal may be determined based on the first low voltage VGL1 and the second low voltage VGL2.

In an embodiment, the first pad PD1 and the second pad PD2 are not electrically and physically connected to each other. In addition, lines connected to the first pad PD1 and lines connected to the second pad PD2 are not electrically and physically connected to each other.

The third voltage VGH1 (hereinafter, referred to as a first high voltage) may be transferred to the third pad PD3, and the fourth voltage VGH2 (hereinafter, referred to as a second high voltage) may be transferred to the fourth pad PD4. In some embodiments, the first high voltage VGH1 and the second high voltage VGH2 may have the same value. For example, the first high voltage VGH1 and the second high voltage VGH2 may have the same second gate power voltage VGH value. However, the inventive concepts are not limited thereto, and the first high voltage VGH1 and the second high voltage VGH2 may be different from each other in other embodiments.

A logic high level of the scan signals and the emission control signal may be determined based on the first high voltage VGH1 and the second high voltage VGH2.

In an embodiment, the third pad PD3 and the fourth pad PD4 are not electrically and physically connected to each other. In addition, lines connected to the third pad PD3 and lines connected to the fourth pad PD4 are not electrically and physically connected to each other.

The first pad PD1 may be connected to a first power line PL1. The first power line PL1 may transfer the first low voltage VGL1 to the first scan driver 220 and the emission driver 260. In an embodiment, the first power line PL1 may branch off at a first line node LN1 of the non-display area to be connected to the first scan driver 220 and the emission driver 260.

The third pad PD3 may be connected to a third power line PL3. The third power line PL3 may transfer the first high voltage VGH1 to the first scan driver 220 and the emission driver 260. In an embodiment, the third power line PL3 may branch off at a second line node LN2 of the non-display area to be connected to the first scan driver 220 and the emission driver 260.

As described above with reference to FIG. 3, the first scan driver 220 and the emission driver 260 may be driven in the first period P1 and the second period P2 of the frame period FP, and respectively output the first scan signal and the emission control signal in the first non-emission period NEP1 and the second non-emission period NEP2. That is, the first scan signal and the emission control signal may be output in a constant period based on the first low voltage VGL1 and the first high voltage VGH1 regardless of the frame frequency. Therefore, although the first scan driver 220 and the emission driver 260 share the first power line PL1 and a second power line PL2, a change in equivalent impedance for generating the first scan signal and the emission control signal is not large.

The second scan driver 240 may generate the second scan signal and the third scan signal by operating only in the first non-emission period NEP1 of the frame period.

When the first scan driver 220, the second scan driver 240, and the emission driver 260 share the first power line PL1, the amount of voltage drop in the first low voltage VGL1 during the first period P1 (e.g., the first non-emission period NEP1) and the second period P2 (e.g., the second non-emission period NEP2) may be different from each other due to the difference between equivalent impedances in the first period P1 and the second period P2. Similarly, when the first scan driver 220, the second scan driver 240, and the emission driver 260 share the third power line PL3, the amount of voltage drop in the first high voltage VGH1 during the first period P1 and the second period P2 may be different from each other due to a difference between equivalent impedances in the first period P1 and the second period P2.

The logic low level and the logic high level of the scan signals and the emission control signal may be changed due to the difference between the amount of voltage drop in the gate power voltages (VGL and VGH shown in FIG. 1) during the first period P1 and the second period P2. In addition, voltages of the gate electrodes of the transistors included in the pixel PXij and/or voltage coupling amounts of the gate electrodes in a given period may be changed due to capacitances of parasitic capacitors connected to the gate electrodes. Such unintended change in voltages of the gate electrodes of the transistors may cause an image flicker.

In order to minimize the change in the amount of voltage drop of the gate power voltages (VGL and VGH shown in FIG. 1), the second power line PL2 and a fourth power line PL4, which are connected to the second scan driver 240, may be respectively separated from the first power line PL1 and the third power line PL3. As such, the second scan driver that is driven at a different timing from the first scan driver 220 and the emission driver 260 may be applied with the second low voltage VGL2 and the second high voltage VGH2 through power lines different from those supplying the first low voltage VGL1 and the first high voltage VGH1.

The second pad PD2 may be connected to the second power line PL2. The second power line PL2 may transfer the second low voltage VGL2 to the second scan driver 240. In an embodiment, the second low voltage VGL2 may be equal to the first low voltage VGL1.

The fourth pad PD4 may be connected to the fourth power line PL4. The fourth power line PL4 may transfer the second high voltage VGH2 to the second scan driver 240. In an embodiment, the second high voltage VGH2 may be equal to the first high voltage VGH1.

As described above, the second scan driver 240 may supply the second scan signal and the third scan signal to the pixel PXij. As such, the configurations of two scan drivers for respectively generating the second scan signal and the third scan signal are integrated as one, thereby reducing the area of the non-display area (dead space).

The power lines PL2 and PL4 for transferring the gate power voltages VGL and VGH to the second scan driver 240 may be electrically and physically separated from the power lines PL1 and PL3 that transfer the gate power voltage VGL and VGH to the first scan driver 220 and the emission driver 260. Thus, in low-frequency driving in which a first period P1 and at least one second period P2 are included in one frame period, an image flicker that may occur due to the difference between the amount of voltage drop in the gate power voltages VGL and VGH during the first period P1 and the second period P2 can be minimized.

FIG. 5 is a schematic plan view illustrating the portion of the display device shown in FIG. 1 according to another embodiment.

In a display device shown in FIG. 5, a configuration of power lines are identical to that of the power lines PL1 to PL4 of FIG. 4, except that a first power line PL1 and a second power line PL2 additionally branch off. As such, components identical or corresponding to those shown in FIG. 4 are designated by like reference numerals, and repeated descriptions thereof will be omitted.

Referring to FIGS. 1 and 5, the display device 1000 may include a substrate 1. The substrate 1 may include a display area and a non-display area located near at least one side of the display area.

A gate driver 200 may be provided in the non-display area of the substrate 1, and a plurality of pads PD1, PD2, PD3, and PD4 may be disposed in the non-display area of the substrate 1. The gate driver 200 may include a first scan driver 220, a second driver 240, and an emission driver 260.

In an embodiment, a first power line PL1 may branch off into a first scan power line SPL1, a second scan power line SPL2, a first emission power line EPL1, and a second emission power line EPL2. The first scan power line SPL1 and the second scan power line SPL2 may be connected to stages of the first scan driver 220. The first scan power line SPL1 and the second scan power line SPL2 may transfer a first low voltage VGL1 to the first scan driver 220.

Each of the stages of the first scan driver 220 may include ten or more transistors, and have a complex circuit structure well known in the art. The first low voltage VGL1 may be supplied to the first scan driver 220 through the first scan power line SPL1 and the second scan power line SPL2 to prevent an unintended voltage variation of the first low voltage VGL1, a short circuit between the first power line PL1 and other elements, and the like, that may be caused by the circuit size and the circuit complexity. For the same reason, other power lines (e.g., a second power line PL2) may branch off into a plurality of branch power lines to be connected to the emission driver 260 and/or the second scan driver 240.

The first emission power line EPL1 and the second emission power line EPL2 may be connected to stages of the emission driver 260. The first emission power line EPL1 and the second emission power line EPL2 may transfer the first low voltage VGL1 to the emission driver 260. Each of the stages of the emission driver 260 may also include ten or more transistors, and include a complex circuit structure.

In an embodiment, the second power line PL2 may branch off into a third scan power line SPL3 and a fourth scan power line SPL4. The third scan power line SPL3 and the fourth scan power line SPL4 may be connected to stages of the second scan driver 240. The third scan power line SPL3 and the fourth scan power line SPL4 may transfer a second low voltage VGL2 to the second scan driver 240.

Accordingly, the gate driver 200 according to the illustrated embodiment may improve the output stability. A configuration in which a power line branches off to be connected to a stage will be described in more detail with reference to FIGS. 7 and 8.

The configuration shown in FIG. 5, in which the power line branches off, is merely illustrative, and the inventive concepts are not limited thereto. For example, a third power line PL3 and a fourth power line PL4 may also branch off to be connected to stages respectively corresponding thereto.

Figure 6:
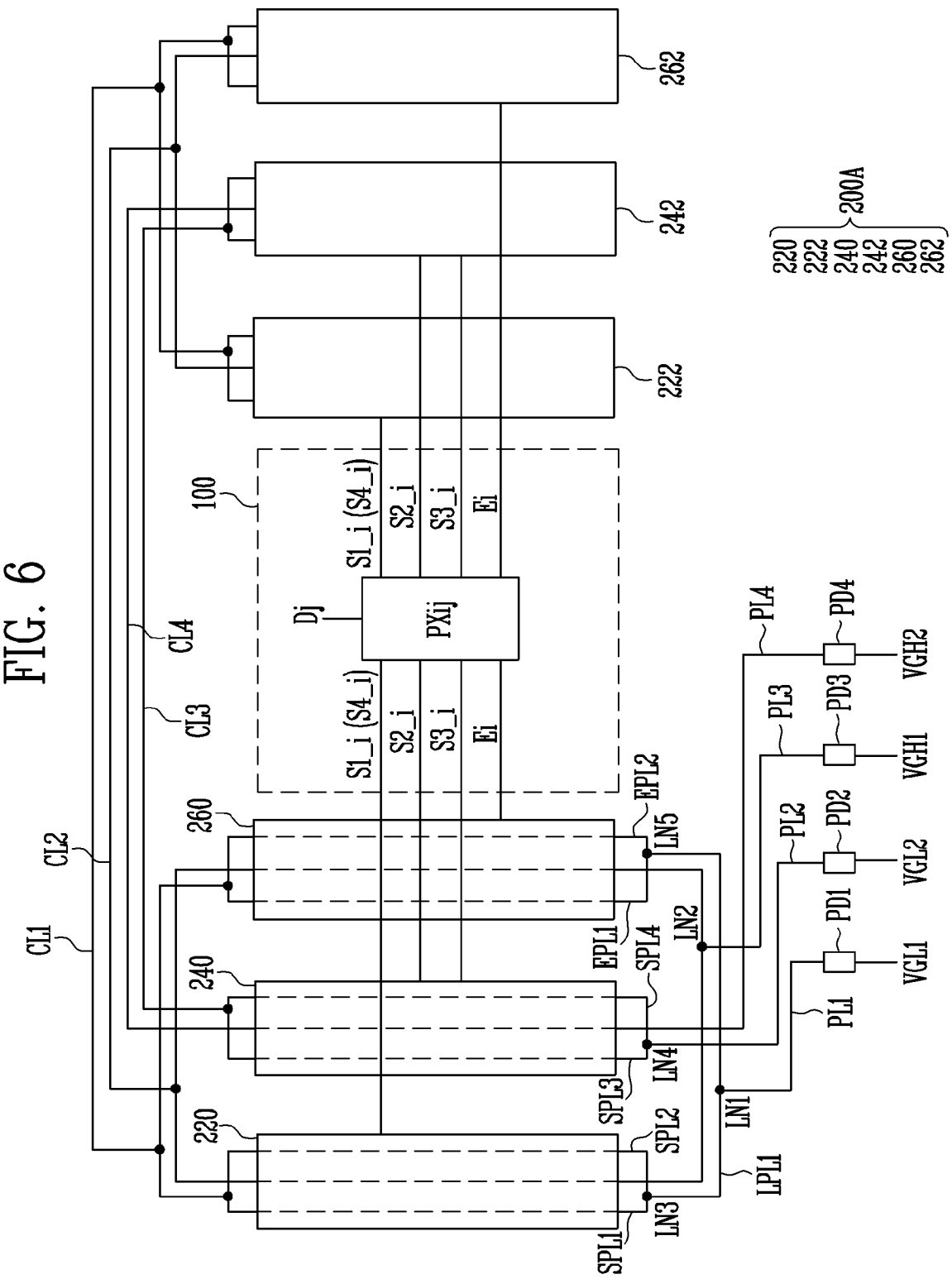
FIG. 6 is a schematic plan view illustrating the portion of the display device shown in FIG. 1 according to still another embodiment.

FIG. 6 is a schematic plan view illustrating the portion of the display device shown in FIG. 1 according to still another embodiment.

In a display device shown in FIG. 6, a configuration of the display device is substantially identical to those of the display devices described with reference to FIGS. 4 and 5, except that a gate driver 200A is disposed at both sides of a pixel unit 100. As such, components identical or corresponding to those shown in FIGS. 4 and 5 are designated by like reference numerals, and repeated descriptions thereof will be omitted.

Referring to FIG. 6, the gate driver 200A may include a first scan driver 220, a second scan driver 240, an emission driver 260, a first auxiliary scan driver 222, a second auxiliary scan driver 242, and an auxiliary emission driver 262.

In an embodiment, the first scan driver 220, the second scan driver 240, and the emission driver 260 may be disposed at one side (e.g., a left side) of the pixel unit 100, and the first auxiliary scan driver 222, the second auxiliary scan driver 242, and the auxiliary emission driver 262 may be disposed at the other side (e.g., a right side) of the pixel unit 100.

The first auxiliary scan driver 222 may be driven identically to the first scan driver 220. In an embodiment, a first scan line S1_i and a fourth scan line S4_i may be commonly connected to the first scan driver 220 and the first auxiliary scan driver 222.

The second auxiliary scan driver 242 may be driven identically to the second scan driver 240. In an embodiment, a second scan line S2_i and a third scan line S3_i may be commonly connected to the second scan driver 240 and the second auxiliary scan driver 242.

The auxiliary emission driver 262 may be driven identically to the emission driver 260. In an embodiment, an emission control line Ei may be commonly connected to the emission driver 260 and the auxiliary emission driver 262.

A first scan power line SPL1 and a second scan power line SPL2, which are connected to the first scan driver 220, may be electrically connected to the first auxiliary scan driver 222 through a first connection line CL1. A second power line PL2 may be electrically connected to the second auxiliary scan driver 242 and the auxiliary emission driver 262 through a second connection line CL2.

A third scan power line SPL3 and a fourth scan power line SPL4 may be electrically connected to the second auxiliary scan driver 242 through a third connection line CL3. A fourth power line PL4 may be electrically connected to the second auxiliary scan driver 242 through a fourth connection line CL4.

A first emission power line EPL1 and a second emission power line EPL2 may be electrically connected to the auxiliary emission driver 262 through the first connection line CL1.

In FIG. 6, while the drivers 220, 240, and 260 are illustrated as being disposed at the left side of the pixel unit 100, and the drivers 222, 242, and 262 are illustrated as being disposed at the right side of the pixel unit 100, this is merely illustrative, and the arrangement of the drivers is not limited thereto. For example, the drivers 220, 240, and 260 at the left side of the pixel unit 100 and the drivers 222, 242, and 262 at the right side of the pixel unit 100 may be disposed symmetrically to each other with respect to the pixel unit 100 in other embodiments.

Figure 7:
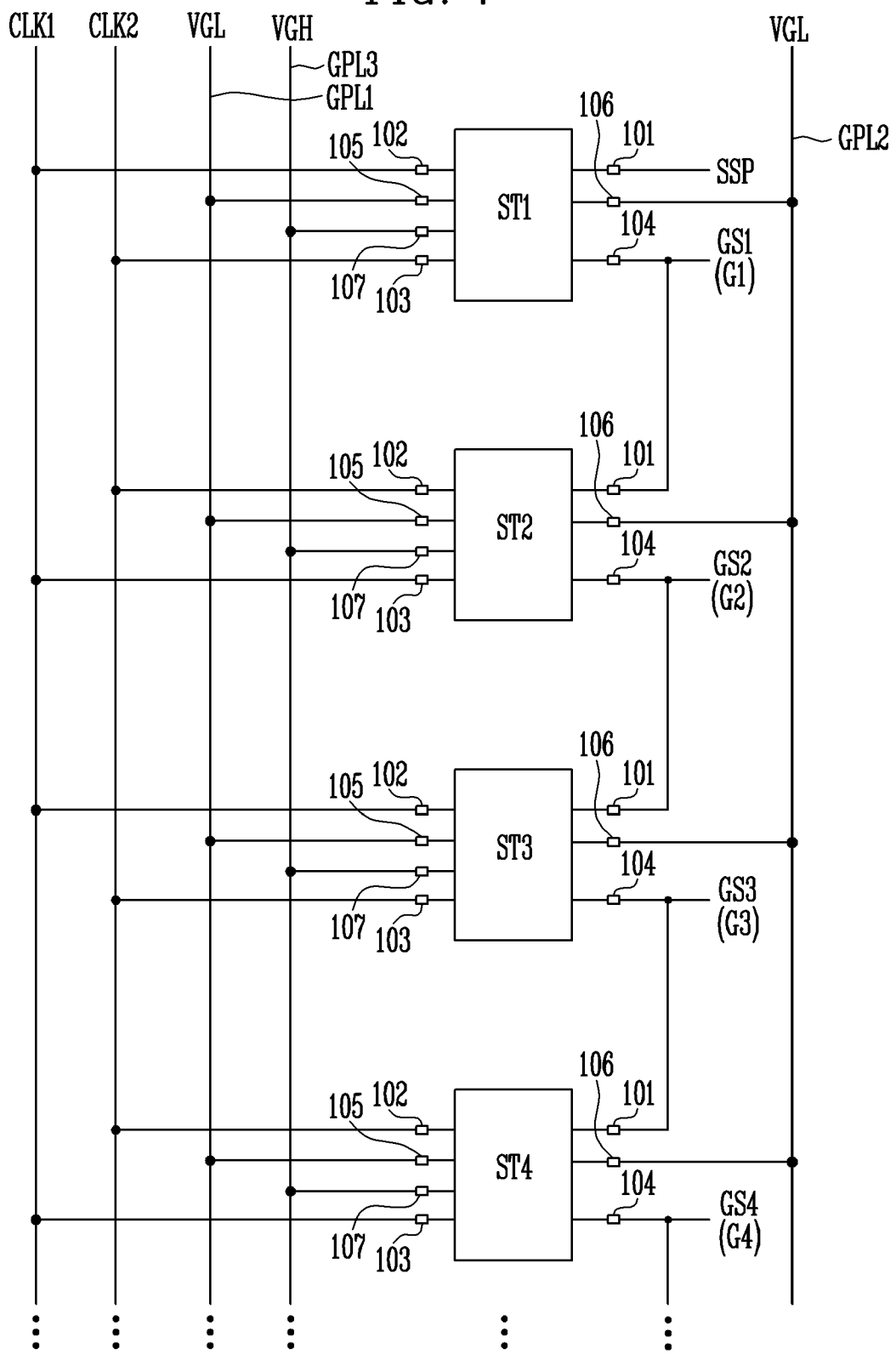
FIG. 7 is an example of a block diagram of a gate driver included in the display device shown in FIG. 1.

FIG. 7 is an example of a block diagram of the gate driver included in the display device shown in FIG. 1.

Hereinafter, four stages and gate signals output therefrom will exemplarily be described with reference to FIG. 7.

Referring to FIGS. 1, 5, and 7, the gate driver 200 may include a plurality of stages ST1 to ST4. For example, the stages ST1 to ST4 may be respectively connected to predetermined gate lines G1 to G4, and output gate signals GS1 to GS4 in accordance to clock signals CLK1 and CLK2. The stages ST1 to ST4 may be substantially implemented with the same circuit.

In an embodiment, the gate driver 200 may include the first scan driver 220, the second scan driver 240, and/or the emission driver 260. For example, the gate lines G1 to G4 may correspond to the first scan lines, second scan lines, or emission control lines, and the gate signals GS1 to GS4 may correspond to a first scan signal, a second scan signal, a third scan signal, or an emission control signal.

Each of the stages ST1 to ST4 may include a first input terminal 101, a second input terminal 102, a third input terminal 103, an output terminal 104, a first power input terminal 105, a second power input terminal 106, and a third power input terminal 107.

The first input terminal 101 may receive an output signal of a previous stage or a start pulse SSP. For example, the first input terminal 101 of the first stage ST1 may receive the start pulse SSP, and the first input terminal 101 of a second stage ST2 may receive a gate signal output from the first stage ST1.

In an embodiment, the second input terminal 102 of a $k^{th}$ (k is a natural number) stage may receive a first clock signal CLK1, and the third input terminal 103 of the $k^{th}$ stage may receive a second clock signal CLK2. On the other hand, the second input terminal 102 of a $(k+1)^{th}$ stage may receive the second clock signal CLK2, and the third input terminal of the $(k+1)^{th}$ stage may receive the first clock signal CLK1.

The first clock signal CLK1 and the second clock signal CLK2 have the same period, and phases of the first clock signal CLK1 and the second clock signal CLK2 may not overlap with each other. For example, the second clock signal CLK2 may be set as a signal shifted by about a half period from the first clock signal CLK1.

Each output terminal 104 may be connected to a corresponding gate line among the gate lines G1 to G4. A corresponding gate signal among the gate signals GS1 to GS4 may be output through the output terminal 104.

The first power input terminal 105 may be connected to a first gate power line GPL1 for transferring a first gate power voltage VGL. The first gate power line GPL1 may correspond to the first scan power line SPL1, the third scan power line SPL3, and the first emission power line EPL1, which are shown in FIG. 5. For example, the first power input terminal 105 may be connected to the first scan power line SPL1 for transferring the first low voltage VGL1.

The second power input terminal 106 may be connected to a second gate power line GPL2 for transferring the first gate power voltage VGL. The second gate power line GPL2 may correspond to the second scan power line SPL2, the fourth scan power line SPL4, and the second emission power line EPL2, which are shown in FIG. 5. For example, the second power input terminal 106 may be connected to the second scan power line SPL2 for transferring the first low voltage VGL1.

As described above, the stages ST1 to ST4 may be connected to two gate power lines GPL1 and GPL2 for transferring the first gate power voltage VGL.

The third power input terminal 107 may be connected to a third gate power line GPL3 for transferring a second gate power voltage VGH. The third gate power line GPL3 may correspond to the third power line PL3 and the fourth power line PL4, which are shown in FIG. 5. For example, the third power input terminal 107 may be connected to the third power line PL3 for transferring the first high voltage VGH1.

Figure 8:
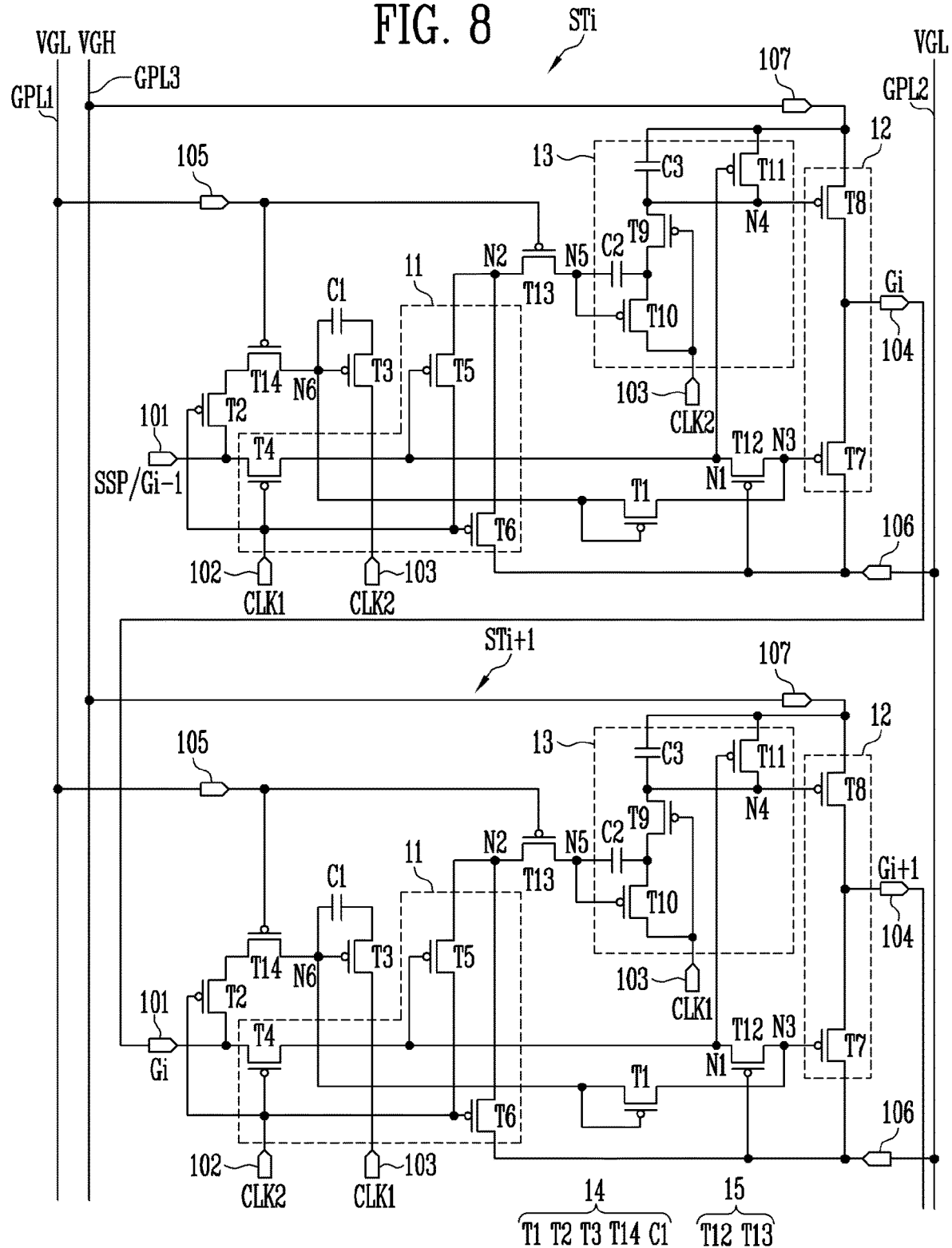
FIG. 8 is an example of a circuit diagram of stages of the gate driver shown in FIG. 7.

FIG. 8 is an exemplarily circuit diagram illustrating the stages of the gate driver shown in FIG. 7.

Referring to FIGS. 5, 7, and 8, each of an $i^{th}$ stage STi (i is a natural number) and an $(i+1)^{th}$ stage STi+1 may include an input unit 11, an output unit 12, a first signal processor 13, a second signal processor 14, and a stabilizer 15.

As shown in FIG. 8, the $i^{th}$ stage STi (e.g., an odd-numbered stage) in which the first clock signal CLK1 is supplied to the second input terminal 102 and the second clock signal CLK2 is supplied to the third input terminal 103, will be mainly described. In the $(i+1)^t$ stage STi+1 (e.g., an even-numbered stage), the second clock signal CLK2 may be supplied to the second input terminal 102, and the first clock signal CLK1 may be supplied to the third input terminal 103. The $(i+1)^{th}$ stage STi+1 may output a gate signal to an $(i+1)^{th}$ gate line Gi+1.

In an embodiment, the start pulse SSP may be supplied to the first input terminal 101 of the first stage ST1, and a gate signal of a previous gate line may be supplied to the first input terminal 101 of each of the other stages.

Hereinafter, the $i^{th}$ stage STi designated as a stage STi will be described in more detail.

The input unit 11 may control a voltage of a first node N1 and a voltage of a second node N2 in response to signals supplied to the first input terminal 101 and the second input terminal 102. In an embodiment, the input unit 11 may include a fourth transistor T4, a fifth transistor T5, and a sixth transistor T6.

The fourth transistor T4 may be connected between the first input terminal 101 and the first node N1. The fourth transistor T4 may include a gate electrode connected to the second input terminal 102. The fourth transistor T4 may be turned on when the first clock signal CLK1 has a gate-on level (for example, a low level), to electrically connect the first input terminal 101 and the first node N1.

The fifth transistor T5 may be connected between the second input terminal 102 and the second node N2. The fifth transistor T5 may include a gate electrode connected to the first node N1. The fifth transistor T5 may be turned on or turned off based on the voltage of the first node N1.

The sixth transistor T6 may be connected between the second power input terminal 106 to which the first gate power voltage VGL is supplied and the second node N2. A gate electrode of the sixth transistor T6 may be connected to the second input terminal 102. The sixth transistor T6 may be turned on when the first clock signal CLK1 is supplied to the second input terminal 102, to supply the first gate power voltage VGL to the second node N2.

The output unit 12 may supply the first gate power voltage VGL or the second gate power voltage VGH to the output terminal 104 based on a voltage of a third node N3 and a voltage of a fourth node N4. The gate signal may be determined as a first scan signal, a second scan signal, a third scan signal, or an emission control signal.

In an embodiment, the output unit 12 may include a seventh transistor T7 and an eighth transistor T8.

The seventh transistor T7 may be connected between the second power input terminal 106 and the output terminal 104. A gate electrode of the seventh transistor T7 may be connected to the third node N3. The seventh transistor T7 may be turned on or turned off in response to the voltage of the third node N3. When the seventh transistor T7 is turned on, a gate signal supplied to the output terminal 104 may have a low level (e.g., a gate-off voltage of an N-type transistor).

The eighth transistor T8 may be connected between the third power input terminal 107 to which the second gate power voltage VGH is supplied and the output terminal 104. A gate electrode of the eighth transistor T8 may be connected to the fourth node N4. The eighth transistor T8 may be turned on or turned off in response to the voltage of the fourth node N4. When the eighth transistor T8 is turned on, a gate signal supplied to the output terminal 104 may have a high level (e.g., a gate-on voltage of an N-type transistor).

The first signal processor 13 may control the voltage of the fourth node N4. For example, when the voltage of the second node N2 has a high level, the first signal processor 13 may cause the voltage of the fourth node N4 to stably have a gate-off level (or high level), so that the eighth transistor T8 can be completely turned off. Also, the first signal processor 13 may control the voltage of the fourth node N4 to have a gate-on level (or low level) by using a low level of the second node N2.

In an embodiment, the first signal processor 13 may include a ninth transistor T9, a tenth transistor T10, an eleventh transistor T11, a second capacitor C2, and a third capacitor C3.

A first terminal of the second capacitor C2 may be connected to a fifth node N5. A second terminal of the second capacitor C2 may be connected between the ninth transistor T9 and the tenth transistor T10.

The ninth transistor T9 may be connected between the second terminal of the second capacitor C2 and the fourth node N4. A gate electrode of the ninth transistor T9 may be connected to the third input terminal 103. The ninth transistor T9 may be turned on in response to a gate-on level (e.g., a low level) of the second clock signal CLK2 supplied to the third input terminal 103.

The tenth transistor T10 may be connected between the second terminal of the second capacitor C2 and the third input terminal 103. A gate electrode of the tenth transistor T10 may be connected to the fifth node N5. The tenth transistor T10 may be turned on or turned off in response to a voltage of the fifth node N5.

The eleventh transistor T11 may be connected between the third power input terminal 107 and the fourth node N4. A gate electrode of the eleventh transistor T11 may be connected to the first node N1. The eleventh transistor T11 may be turned on or turned off in response to the voltage of the first node N1.

The third capacitor C3 may be connected between the third power input terminal 107 and the fourth node N4. The third capacitor C3 may charge a voltage applied to the fourth node N4, and stably maintain the voltage of the fourth node N4.

The stabilizer 15 may be electrically connected between the input unit 11 and the output unit 12. The stabilizer 15 may restrict the amount of voltage drop in the first node N and the amount of voltage drop amount in the second node N2. Also, the stabilizer 15 may serve as a resistor when the voltage of the fifth node N5 is considerably lowered due to coupling of the second capacitor C2. Accordingly, the fifth transistor T5 and the sixth transistor T6, which are connected to the second node N2, can be protected.

In an embodiment, the stabilizer 15 may include a twelfth transistor T12 and a thirteenth transistor T13.

The twelfth transistor T12 may be connected between the first node N1 and the third node N3. A gate electrode of the twelfth transistor T12 may be connected to the second power input terminal 106. Therefore, the twelfth transistor T12 may have the turn-on state.

The thirteenth transistor T13 may be connected between the second node N2 and the fifth node N5. A gate electrode of the thirteenth transistor T13 may be connected to the first power input terminal 105 to which the first gate power voltage VGL is supplied. Therefore, the thirteenth transistor T13 may have the turn-on state. Accordingly, the fifth transistor T5 and the sixth transistor T6 can be protected from a voltage variation in the fifth node N5.

In an embodiment, the second signal processor 14 may include a first transistor T1, a second transistor T2, a third transistor T3, a fourteenth transistor T14, and a first capacitor C1.

The first transistor T1 may be connected between the third node N3 and a sixth node N6. A gate electrode of the first transistor T1 may be connected to the sixth node N6. For example, the first transistor T1 may have a diode form, in which the first transistor T1 is connected in a direction from the third node N3 to the sixth node N6.

In an embodiment, the second transistor T2 may be connected between the first input terminal 101 and the sixth node N6. A gate electrode of the second transistor T2 may be connected to the second input terminal 102. The second transistor T2 may be turned on when the first clock signal CLK1 is supplied to the second input terminal 102 to provide the sixth node N6 with a signal supplied to the first input terminal 101.

When a signal having a high level is supplied to the first input terminal 101, the first transistor T1 may function as a reverse diode, and thus, a voltage of the sixth node N6 may have no influence on the third node N3.

The third transistor T3 may be connected between the third input terminal 103 and an electrode of the first capacitor C1. For example, a first electrode of the third transistor T3 may be connected to the third input terminal 103 and a second electrode of the third transistor T3 may be connected to the first capacitor C1. The third transistor T3 may include a gate electrode connected to the sixth node N6. The third transistor T3 may be turned on or turned off in response to the voltage of the sixth node N6.

The first capacitor C1 may be connected between the sixth node N6 and the second electrode of the third transistor T3. A voltage level of the sixth node N6 may swing in a predetermined range due to coupling of the first capacitor C1 according to a change in voltage of the second electrode of the third transistor T3. That is, the voltage of the sixth node N6 may follow a change in voltage level of the second clock signal CLK2.

The first transistor T1 diode-connected between the sixth node N6 and the third node N3 may operate as a charge pump. For example, the voltage of the sixth node N6, which has a form similar to that of an AC voltage, may be converted into a form such as a DC voltage at the third node N3 through the first transistor T1.

In this manner, although the voltage of the sixth node N6 may be changed, the voltage of the third node N3 can be maintained at a constant level by the first transistor T1 that functions as a charge pump.

The fourteenth transistor T14 may be connected between the second transistor T2 and the sixth node N6. A gate electrode of the fourteenth transistor T14 may be connected to the first power input terminal 105. Therefore, the fourteenth transistor T14 may have the turn-on state. In this manner, a bias stress which may be applied to the second transistor T2 can be reduced.

In an embodiment, the first gate power line GPL1 and the second gate power line GPL2 may be disposed at both sides of the stage STi. Some transistors that can be more easily connected to the first gate power line GPL1 may be connected to the first power line GPL1 to receive the first gate power voltage VGL, and other transistors may be connected to the second power line GPL2 to receive the first gate power voltage VGL. Accordingly, the output stability of the gate signal can be improved.

Figure 9:
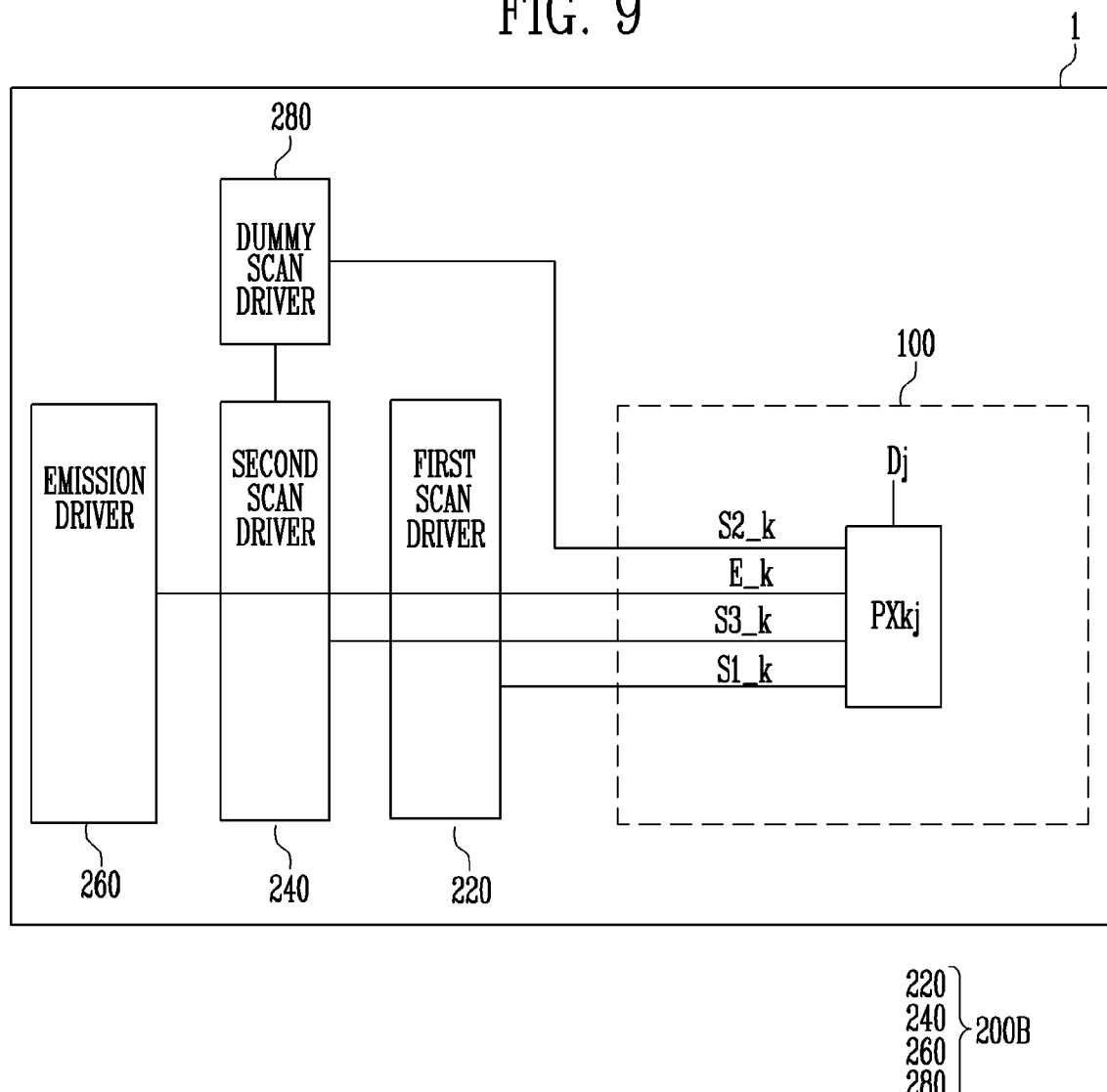
FIG. 9 is a schematic plan view exemplarily illustrating the gate driver included in the display device shown in FIG. 1.

FIG. 9 is a schematic plan view exemplarily illustrating the gate driver included in the display device shown in FIG. 1. FIG. 10 is an example of a waveform diagram of signals output from the gate driver shown in FIG. 9.

Referring to FIGS. 1, 2, 3, 9, and 10, a gate driver 200B may include a first scan driver 220, a second scan driver 240, an emission driver 260, and a dummy scan driver 280.

The dummy scan driver 280 may be disposed in a non-display area of a substrate 1. The dummy scan driver 280 may supply a second scan signal to some of second scan lines S2_1 to S2_i. In an embodiment, the dummy scan driver 280 may include a plurality of dummy stages which sequentially output the second scan signal to some of the second scan lines S2_1 to S2_i.

As shown in FIG. 9, a pixel PXkj may be connected a $k^{th}$ (k is a natural number) first scan line S1_k, a $k^{th}$ second scan line S2_k, a $k^{th}$ third scan line S3_k, and a $k^{th}$ emission control line E_k. The $k^{th}$ second scan line S2_k may be connected to the dummy scan driver 280, and the $k^{th}$ third scan line S3_k may be connected to the second scan driver 240.

The second scan driver 240 outputs both the second scan signal and a third scan signal shifted by a predetermined period from the second scan signal, and thus, the number of scan drivers can be decreased. However, since the second scan signal and the third scan signal are output from one second scan driver 240, some of the scan lines may not be supplied with a scan signal. As such, the dummy scan driver 280 may supplement the absence of the scan signal.

FIG. 10 exemplarily illustrates signals supplied to scan lines and emission control lines, which are connected to a portion of the pixel unit 100. For example, some of scan signals and emission control signals, which are supplied to first to twelfth pixel rows, are illustrated in FIG. 10. Widths of gate-on periods of a first scan signal, a second scan signal, and an emission control signal may be different from one another.

The emission driver 260 may sequentially supply an emission control signal to emission control lines E1 to E12. Two consecutive emission control lines may share one emission control signal. For example, an emission control signal having the same timing may be supplied to a first emission control line E1 and a second emission control line E2. The sharing structure of the emission control lines may improve image quality in high-frequency image driving of a high-resolution display device.

The first scan driver 220 may sequentially supply a first scan signal to first scan lines S1_1 to S1_12. The first scan driver 220 may supply a first scan signal at different timing for the respective pixel rows so as to correspond to the supply of a data signal. In an embodiment, the pulse width of the first scan signal (the width of a gate-on period) may correspond to about one horizontal period 1H.

The second scan driver 240 may supply a third scan signal to third scan lines S3_1 to S3_12. Two consecutive third scan lines may share one third scan signal.

As described above with reference to FIG. 3, the third scan signal supplied to the pixel PXkj may be a signal shifted by a predetermined horizontal period from the second scan signal. More particularly, data writing and threshold voltage compensation may be performed by the third scan signal after the gate voltage of the first transistor M1 is initialized by the second scan signal.

In an embodiment, as shown in FIG. 10, a third scan signal supplied to the first pixel row may be identical to a signal shifted by 10 horizontal periods 10H from the second scan signal supplied to the first pixel row. A third scan signal supplied to third scan lines S3_1 and S3_2 corresponding to the first pixel row and the second pixel row may be supplied to second scan lines S2_11 and S2_12 corresponding to the eleventh pixel row and the twelfth pixel row. In this case, the second scan driver 240 may not generate a second scan signal supplied to second scan lines S2_1 to S2_10 of the first to tenth pixel rows.

According to an embodiment, the dummy scan driver 280 may generate the second scan signal supplied to the second scan lines S2_1 to S2_10 of the first to tenth pixel rows. In particular, the dummy scan driver 280 may supply the second scan signal to the second scan lines S2_1 to S2_10 of initial pixel rows corresponding to a time difference between the second scan signal and the third scan signal, which are supplied to one pixel row.

Figure 11A:
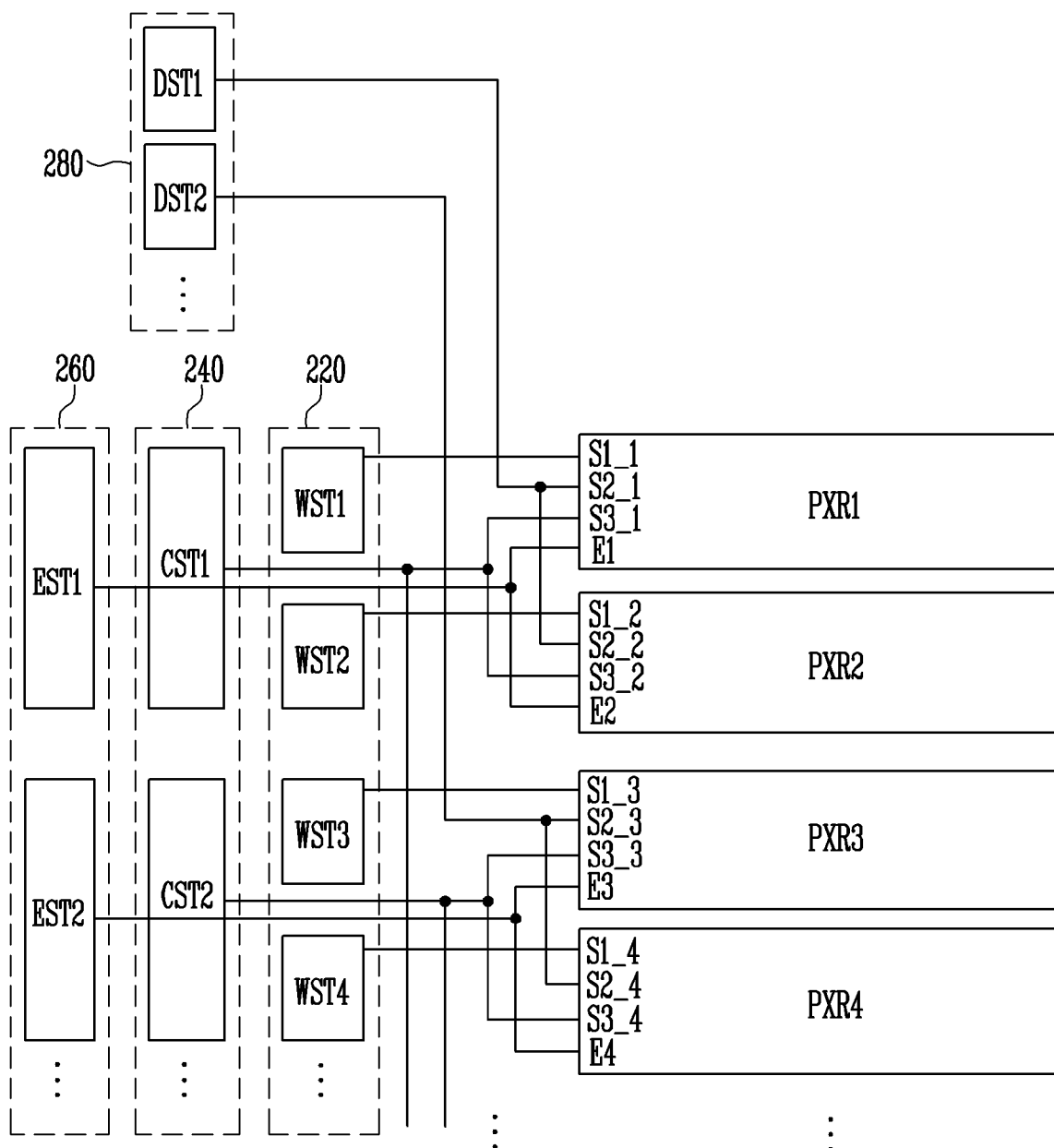
FIGS. 11A and 11B are diagrams illustrating connection between the gate driver shown in FIG. 9 and pixel rows.
Figure 11B:
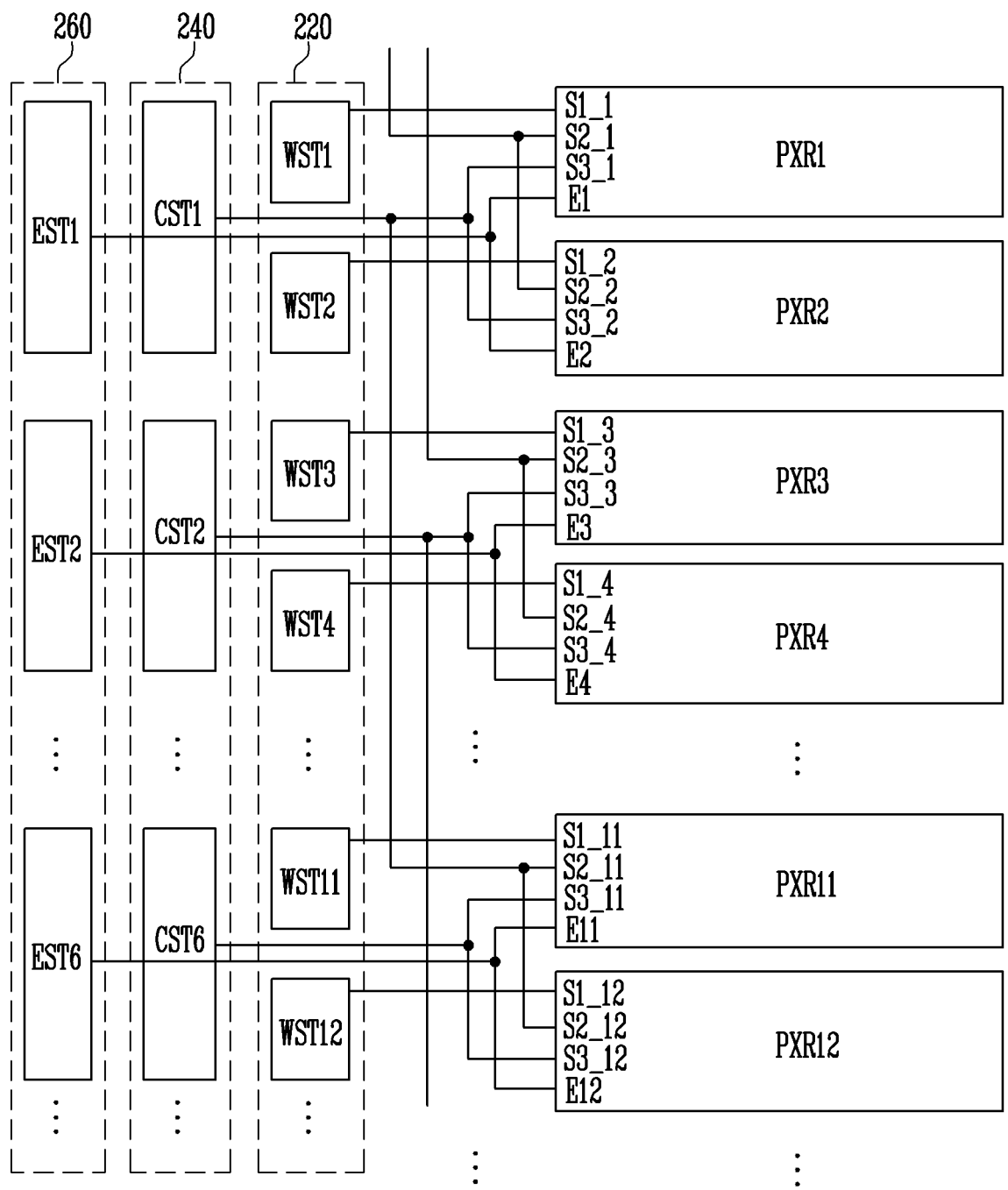

FIGS. 11A and 11B are diagrams illustrating a connection between the gate driver shown in FIG. 9 and pixel rows.

Referring to FIGS. 9 to 11B, the second scan driver 240 may be connected to some of the second scan lines S2_1 to S2_12 and the third scan lines S3_1 to S3_12, and the dummy scan driver 280 may be connected to the remaining second scan lines S2_1 to S2_12.

FIGS. 11A and 11B illustrate an example of a connection between the gate driver 200b, which implements the waveform diagram shown in FIG. 10, and pixel rows PXR1 to PXR12.

The first scan driver 220 may include write stages WST1 to WST12 respectively corresponding to the pixel rows PXR1 to PXR12. The write stages WST1 to WST12 may be respectively connected to the first scan lines S1_1 to S1_12.

The emission driver 260 may include a plurality of emission stages EST1 to EST6. One of the emission stages EST1 to EST6 may be connected to two consecutive emission control lines. For example, a first emission stage EST1 may be connected to an emission control line E1 of a first pixel row PXR1 and an emission control line E2 of a second pixel row PXR2. Therefore, a number of the emission stages EST1 to EST6 may be a half of that of the pixel rows PXR1 to PXR12.

The second scan driver 240 may include a plurality of compensation stages CST1 to CST6. One of the compensation stages CST1 to CST6 may be connected to two consecutive second scan lines and two consecutive third scan lines. Therefore, a number of the compensation stages CST1 to CST6 may be a half of that of the pixel rows PXR1 to PXR12.

For example, a first compensation stage CST1 may be connected to a third scan line S3_1 of the first pixel row PXR1, a third scan line S3_2 of the second pixel row PXR2, a second scan line S2_11 of an eleventh pixel row PXR11, and a second scan line S2_12 of a twelfth pixel row PXR12. The same scan signal may be supplied to the third scan line S3_1 of the first pixel row PXR1, the third scan line S3_2 of the second pixel row PXR2, the second scan line S2_11 of the eleventh pixel row PXR11, and the second scan line S2_12 of the twelfth pixel row PXR12. The third scan signal supplied to the third scan line S3_1 of the first pixel row PXR1 may be identical to a signal shifted by 10 horizontal periods 10H from the second scan signal supplied to the second scan line S2_1 of the first pixel row PXR1.

The second scan driver 240 may not supply the second scan signal to second scan lines S2_1 to S2_10 of ten initial pixel rows. That is, when the pixel unit 100 includes n (n is a natural number greater than k+1) pixel rows, the second scan driver 240 may be connected to third scan lines of first to $k^{th}$ pixel rows, and be connected to second scan lines and third scan lines of $(k+1)^{th}$ to $n^{th}$ pixel rows.

The dummy scan driver 280 may include a plurality of dummy stages DST1, DST2, . . . , DSTn. The dummy scan driver 280 may supply the second scan signal to the second scan lines S2_1 to S2_10 of the ten initial pixel rows. In other words, the dummy scan driver 280 may be connected to second scan lines of initial pixel rows corresponding to the difference between supply times of the second scan signal and the third scan signal. In an embodiment, an output of a last dummy stage of the dummy scan driver 280 may be supplied as an input of a first stage (i.e., a first compensation stage CST1) of the second scan driver 240.

One of the dummy stages DST1, DST2, . . . , DSTn may be connected to two consecutive second scan lines. For example, a first dummy stage DST1 may be connected to the second scan line S2_1 of the first pixel row PXR1 and the second scan line S2_2 of the second pixel row PXR2. Therefore, a number of the dummy stages DST1, DST2, . . . , DSTn may be a half of that of the pixel rows PXR1 to PXR12. When the difference between supply times of the second scan signal and the third scan signal to the same pixel row is 10 horizontal periods 10H, the dummy scan driver 280 may include five dummy stages DST1, DST2, . . . , DST5.

Accordingly, the number of stages of the gate driver 200B can be decreased, and a dead space of the display device can be reduced.

Figure 12:
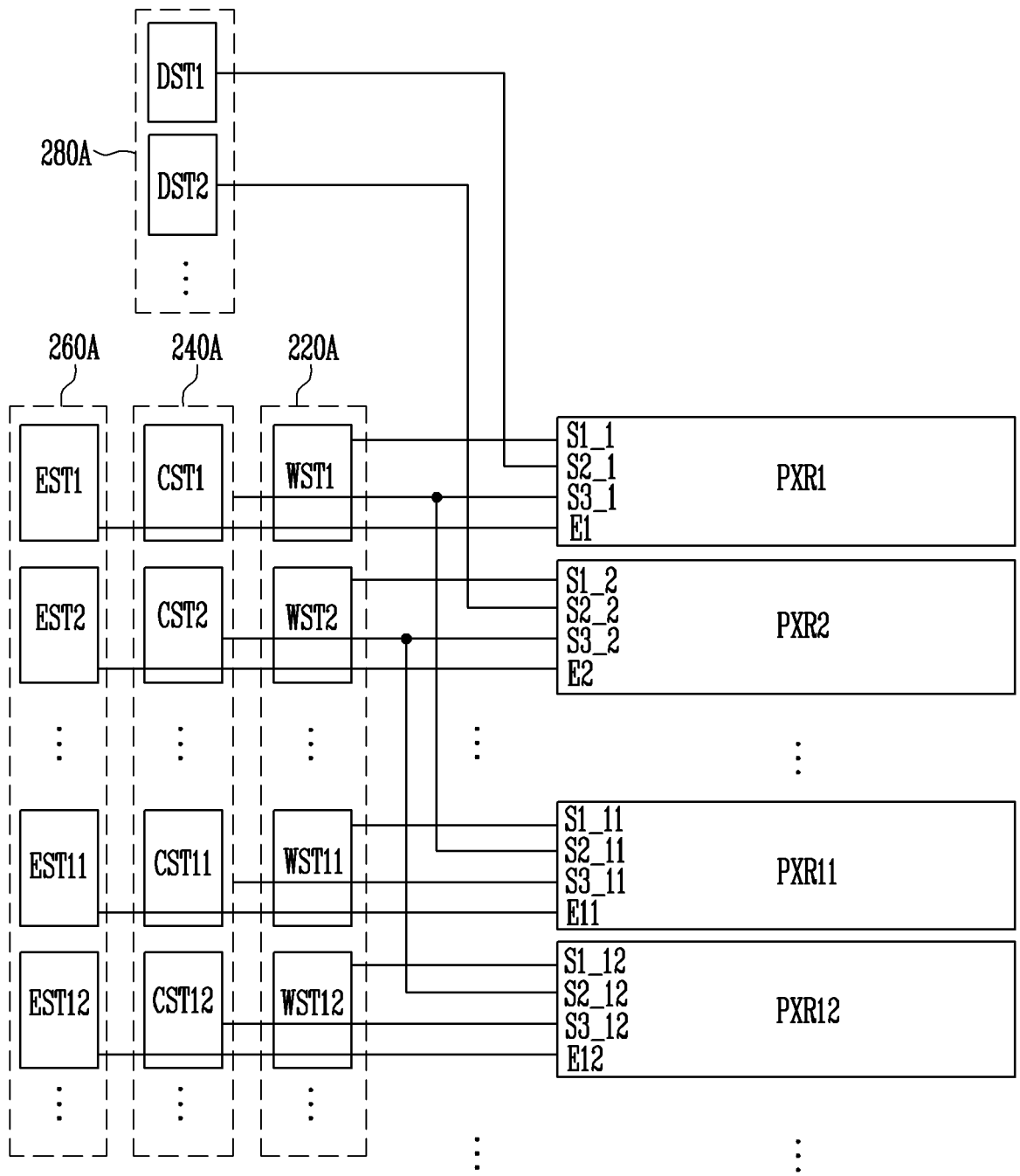
FIG. 12 is another example of a diagram illustrating the connection between the gate driver shown in FIG. 9 and the pixel rows.

FIG. 12 is another example of a diagram illustrating the connection between the gate driver shown in FIG. 9 and the pixel rows.

A configuration shown in FIG. 12 is identical to that described with reference to FIGS. 11A and 11B, except that the stages of an emission driver 260A and a second scan driver 240A are connected one-to-one to the pixel rows. Therefore, components identical or corresponding to those shown in FIGS. 11A and 11B are designated by like reference numerals, and repeated descriptions thereof will be omitted.

Referring to FIGS. 9 and 12, the second scan driver 240A may be connected to some (e.g., S2_11 and S2_12) of the second scan lines S2_1 to S2_12 and the third scan lines S3_1 to S3_12, and a dummy scan driver 280A may be connected to the remaining second scan lines S2_1 to S2_12.

The emission driver 260A may include a plurality of emission stages EST1 to EST12, for example. The emission stages EST1 to EST12 may be connected one-to-one to the pixel rows PXR1 to PXR12. Therefore, a number of the emission stages EST1 to EST12 may be equal to that of the pixel rows PXR1 to PXR12.

The second scan driver 240A may include a plurality of compensation stages CST1 to CST12. Each of the compensation stages CST1 to CST12 may be connected to one third scan line and one second scan line. The compensation stages CST1 to CST12 may be connected one-to-one to the pixel rows PXR1 to PXR12. Therefore, a number of the compensation stages CST1 to CST12 may be equal to that of the pixel rows PXR1 to PXR12.

The dummy scan driver 280A may supply the second scan signal to second scan lines S2_1 to S2_10 of ten initial pixel rows. Dummy stages DST1, DST2, . . . may be connected one-to-one to some of the second scan lines. When the difference between supply times of the second scan signal and the third scan signal to the same pixel row is 10 horizontal periods 10H, the dummy scan driver 280A may include ten dummy stages DST1, DST2, . . . , DST10.

However, this is merely illustrative, and the corresponding relationship between the stages and the pixel rows is not limited thereto. For example, in some embodiment, each of the emission stages EST1 to EST12 may be connected to three or more emission control lines according to a design of the display device.

As described above, the display device according to embodiments includes a dummy scan driver having a small size, which supplies a scan signal to some of the initial pixel rows, so that configurations of two scan drivers for respectively generating the second scan signal and the third scan signal can be integrated as one. In this manner, the area of the non-display area (dead space) can be reduced.

Further, power lines for transferring gate power voltages to the second scan driver can be electrically and physically separated from those for transferring gate power voltages to the first scan driver and the emission driver. Thus, in low-frequency driving in which a first period (display scan period) and at least one second period (bias scan period) are included in one frame period, an image flicker that may occur due to the difference between the amount of voltage drop in gate power voltages during the first period and the second period can be prevented or minimized.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
    a substrate including a display area and a non-display area;
    pixels disposed in the display area and connected to first scan lines, second scan lines, third scan lines, and emission control lines;
    a first scan driver disposed in the non-display area and configured to supply a first scan signal to the first scan lines;
    a second scan driver disposed in the non-display area and configured to supply a second scan signal to some of the second scan lines and a third scan signal to the third scan lines;
    an emission driver disposed in the non-display area and configured to supply an emission control signal to the emission control lines;
    a first pad and a second pad disposed in the non-display area and spaced apart from each other;
    a first power line connected to the first pad to transfer a first voltage to the first scan driver and the emission driver; and
    a second power line connected to the second pad to transfer a second voltage to the second scan driver,
    wherein the first power line branches off in the non-display area to be connected to the first driver and the emission driver.

2. The display device of claim 1, wherein the first voltage and the second voltage are substantially the same.

3. The display device of claim 2, wherein the second power line is not electrically and physically connected to the first power line in the non-display area.

4. The display device of claim 1, further comprising:
    a third pad and a fourth pad disposed in the non-display area and spaced apart from each other;
    a third power line connected to the third pad to transfer a third voltage higher than the first voltage to the first scan driver and the emission driver; and
    a fourth power line connected to the fourth pad to transfer a fourth voltage higher than the second voltage to the second scan driver.

5. The display device of claim 4, wherein the third power line branches off in the non-display area to be connected to the first scan driver and the emission driver.

6. The display device of claim 4, wherein the third voltage and the fourth voltage are substantially the same.

7. The display device of claim 6, wherein the fourth power line is not electrically and physically connected to the third power line in the non-display area.

8. The display device of claim 4, wherein:
    each of the first scan driver, the second scan driver, and the emission driver includes stages; and
    wherein each of the stages includes a first power input terminal, a second power input terminal, and a third power input terminal.

9. The display device of claim 8, wherein:
    the second power line branches off into a third scan power line and a fourth scan power line; and
    the third scan power line and the fourth scan power line are connected to the stages of the second scan driver.

10. The display device of claim 8, wherein:
    the first power line branches off into a first scan power line, a second scan power line, a first emission power line, and a second emission power line;
    the first scan power line and the second power scan line are connected to the stages of the first scan driver; and
    the first emission power line and the second emission power line are connected to the stages of the emission driver.

11. The display device of claim 10, wherein:
    the first scan power line is connected to the first power input terminal;
    the second scan power line is connected to the second power input terminal; and
    the third power line is connected to the third power input terminal.

12. The display device of claim 1, further comprising a dummy scan driver disposed in the non-display area and configured to supply the second scan signal to the remaining second scan lines.

13. The display device of claim 12, wherein the dummy scan driver includes a plurality of dummy stages configured to sequentially output the second scan signal.

14. The display device of claim 13, wherein an output of a last dummy stage of the dummy scan driver is supplied as an input of a first stage of the second scan driver.

15. The display device of claim 13, wherein:
    the third scan signal supplied to an $i^{th}$ (i is a positive integer) pixel row is identical to a signal shifted by a predetermined $k^{th}$ horizontal periods (k is an integer of 8 or more) from the second scan signal; and
    widths of gate-on periods of the first scan signal, the second scan signal, and the emission control signal are different from one another.

16. The display device of claim 15, wherein:
    each of the dummy stages is connected to the second scan lines of two or more consecutive pixel rows; and
    the dummy scan driver is connected to the second scan lines of first to $k^{th}$ pixel rows.

17. The display device of claim 16, wherein the second scan driver is connected to the third scan lines of the first to $k^{th}$ pixel rows, and is connected to the second and third scan lines of $(k+1)^{th}$ to $n^{th}$ (n is an integer greater than k+1) pixel rows.

18. The display device of claim 17, wherein a first stage of the second scan driver is connected to a third scan line of the first pixel row and a second scan line of the $(k+1)^{th}$ pixel row.

19. A display device comprising:
    pixels connected to first scan lines, second scan lines, third scan lines, and emission control lines;
    a first scan driver configured to supply a first scan signal to the first scan lines;
    a second scan driver configured to supply a second scan signal to some of the second scan lines and a third scan signal to the third scan lines;
    an emission driver configured to supply an emission control signal to the emission control lines; and
    a dummy scan driver including dummy stages configured to supply the second scan signal to the remaining second scan lines,
    wherein the dummy scan driver is connected to the second scan lines of first to $k^{th}$ (k is an integer greater than 1) pixel rows disposed in a display area, and
    wherein the second scan driver is connected to the third scan lines of the first to $k^{th}$ pixel rows, and is connected to the second and third scan lines of $(k+1)^{th}$ to $n^{th}$ (n is an integer greater than k+1) pixel rows.

* * * * *